(12) United States Patent
Van Zyl

(10) Patent No.: US 10,224,184 B2
(45) Date of Patent: *Mar. 5, 2019

(54) SYSTEM AND METHOD FOR CONTROL OF HIGH EFFICIENCY GENERATOR SOURCE IMPEDANCE

(71) Applicant: Advanced Energy Industries, Inc., Fort Collins, CO (US)

(72) Inventor: Gideon Van Zyl, Fort Collins, CO (US)

(73) Assignee: AES Global Holdings, PTE. LTD, Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 15/664,646

(22) Filed: Jul. 31, 2017

(65) Prior Publication Data
US 2017/0330731 A1    Nov. 16, 2017

Related U.S. Application Data

(63) Continuation-in-part of application No. 14/667,079, filed on Mar. 24, 2015, now Pat. No. 9,741,544.

(60) Provisional application No. 61/969,538, filed on Mar. 24, 2014.

(51) Int. Cl.
*H01J 37/32* (2006.01)

(52) U.S. Cl.
CPC .. *H01J 37/32183* (2013.01); *H01J 37/32146* (2013.01)

(58) Field of Classification Search
None
See application file for complete search history.

(56) References Cited

U.S. PATENT DOCUMENTS 6,297,696 B1   10/2001   Abdollahian et al.
6,456,010 B2 *  9/2002   Yamakoshi ....... H01J 37/32082
                                                313/231.31

(Continued)

FOREIGN PATENT DOCUMENTS

JP    S56-165410      12/1981
JP    H09289100 A     11/1997
(Continued)

OTHER PUBLICATIONS

Kim, Joo-Seung, "Korean Office Action Re Application No. 10-2016-7029535", dated Mar. 26, 2018, p. 8, Published in: KR.

(Continued)

*Primary Examiner* — Douglas W Owens
*Assistant Examiner* — Srinivas Sathiraju
(74) *Attorney, Agent, or Firm* — Neugeboren O'Dowd PC

(57) ABSTRACT

Systems and methods for adjusting the source impedance of a generator are disclosed. An exemplary method includes generating a first signal and applying the first signal to a first input of a combiner, generating a second signal and applying the second signal to a second input of said combiner, and combining the first and second signals with the combiner at an output of the combiner to produce power that is delivered to the plasma load. A controllable variable impedance is provided to an isolation port of the combiner, and the controllable variable impedance is adjusted to vary the source impedance of the generator.

9 Claims, 28 Drawing Sheets

(56) References Cited

U.S. PATENT DOCUMENTS

| | | | | |
|---|---|---|---|---|
| 7,693,230 | B2* | 4/2010 | Sorrells | H03C 3/40 375/256 |
| 7,839,223 | B2* | 11/2010 | Van Zyl | H01J 37/32082 315/111.21 |
| 8,237,501 | B2* | 8/2012 | Owen | H03F 1/565 330/124 R |
| 8,344,559 | B2* | 1/2013 | Van Zyl | H01J 37/32082 307/157 |
| 8,416,008 | B2* | 4/2013 | Van Zyl | H01J 37/32183 327/427 |
| 8,575,843 | B2* | 11/2013 | Moore | A61B 18/042 315/111.21 |
| 8,716,984 | B2* | 5/2014 | Mueller | H02P 9/105 322/36 |
| 8,791,772 | B2* | 7/2014 | Owen | H03F 3/189 333/127 |
| 9,060,411 | B2* | 6/2015 | Biloiu | H05H 1/46 |
| 9,124,248 | B2* | 9/2015 | Van Zyl | H01J 37/32183 |
| 9,294,100 | B2* | 3/2016 | Van Zyl | H01J 37/32155 |
| 9,741,544 | B2* | 8/2017 | Van Zyl | H01J 37/32183 |
| 9,854,659 | B2* | 12/2017 | Van Zyl | H05H 1/46 |
| 2003/0215373 | A1* | 11/2003 | Reyzelman | H01J 37/32082 422/186.29 |
| 2008/0132180 | A1 | 6/2008 | Manicone | |
| 2008/0273288 | A1* | 11/2008 | Horowitz | H01G 4/005 361/303 |
| 2010/0283395 | A1* | 11/2010 | Van Zyl | H01J 37/32082 315/160 |
| 2010/0296977 | A1* | 11/2010 | Hancock | A61L 2/14 422/186 |
| 2011/0148303 | A1* | 6/2011 | Van Zyl | H03F 1/56 315/111.21 |
| 2012/0188007 | A1* | 7/2012 | Van Zyl | H01J 37/32183 327/574 |
| 2012/0218042 | A1* | 8/2012 | Mueller | H02P 9/105 330/278 |
| 2013/0193867 | A1* | 8/2013 | Van Zyl | H01J 37/32183 315/240 |
| 2014/0155008 | A1* | 6/2014 | Van Zyl | H01J 37/32155 455/120 |
| 2015/0270104 | A1* | 9/2015 | Van Zyl | H01J 37/32183 315/111.21 |
| 2017/0330731 | A1* | 11/2017 | Van Zyl | H01J 37/32183 |

FOREIGN PATENT DOCUMENTS

| | | |
|---|---|---|
| JP | H11509976 A | 8/1999 |
| JP | 2005527078 A | 9/2005 |
| JP | 2010511353 A | 4/2010 |
| JP | 2010182683 A | 8/2010 |
| JP | 2010193152 A | 9/2010 |
| JP | 2013515446 A | 5/2013 |
| JP | 2014505983 A | 3/2014 |

OTHER PUBLICATIONS

Wittmann-Regis, Agnes, "International Preliminary Report on Patentability Re Application No. PCT/US2015/022223", dated Oct. 6, 2016, p. 7.

Sathiraju, Srinivas, "United States Office Action Re U.S. Appl. No. 14/667,079", dated Sep. 12, 2016, p. 24 Published in: US.

Mitrovic, Bayer, "International Search Report and Written Opinion re Application No. PCT/US2015/022223", dated May 6, 2015, p. 10 Published in: AU.

Koreana Patent Firm, "Response to Korea Office Action Re: Korean Patent Application No. 10-2016-7029535", dated May 26, 2018, Published in: KR.

Fujiwara, Shinji, "Office Action Regarding JP Patent Application No. 2016-558393", dated Nov. 28, 2018, p. 9, Published in: JP.

* cited by examiner

SYSTEM AND METHOD FOR CONTROL OF HIGH EFFICIENCY GENERATOR SOURCE IMPEDANCE

CLAIM OF PRIORITY UNDER 35 U.S.C. § 120

The present Application for Patent is a Continuation of patent application Ser. No. 14/667,079 entitled "SYSTEM AND METHOD FOR CONTROL OF HIGH EFFICIENCY GENERATOR SOURCE IMPEDANCE" filed Mar. 24, 2015, pending, and assigned to the assignee hereof and hereby expressly incorporated by reference herein.

BACKGROUND

Field

The present invention relates generally to plasma processing systems, and more specifically to interactions between power sources and plasmas.

Background

Plasma processing systems are widely used in a variety of industries for modifying the surface properties of materials. For example, the manufacture of modern integrated circuits generally involves many processing steps that use plasmas for etching of submicrometer features, or for depositing atomically thin layers of materials.

A typical plasma processing system comprises a processing chamber and a power delivery system that creates and maintains the plasma inside the chamber. Electrically, the plasma is a load with a characteristic impedance that is driven by the power generator. The impedance of a processing plasma is generally not constant, however, but may vary depending upon process conditions or other variables. Variations in plasma impedance may adversely affect the power delivery from the generator, which typically provides optimal power delivery only for a particular load impedance. These variations may also result in undesired drifts or perturbations in process variables, such as etch or deposition rates, due to changes in the physical properties of the plasma at different power levels. As a result, plasma processing systems are often equipped with impedance matching and control mechanisms or circuitry that respond to changes in plasma impedance and maintain desired levels of power delivery to the plasma.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

According to an aspect, a method for adjusting the source impedance of a generator includes generating a first signal and applying the first signal to a first input of a combiner and generating a second signal and applying the second signal to a second input of the combiner. The first and second signals are combined with the combiner at an output of the combiner to produce power that is delivered to a plasma load, and a controllable variable impedance is provided to an isolation port of the combiner. The controllable variable impedance adjusted to vary the source impedance of the generator.

According to another aspect, a power supply system includes a first power amplifier including an input and a first-amplifier-output and a second power amplifier including an input and a second-amplifier-output. The power supply system also includes a four-port combiner including a first input port disposed to receive a first signal from the first-amplifier-output, a second input port disposed to receive a second signal from the second-amplifier-output, an output port to provide output power, and an isolation port disposed to couple to a terminating impedance. The combiner is configured to combine the first signal and the second signal to apply a power signal to the output port. A controllable variable impedance component is coupled to the isolation port as the terminating impedance, and a controller is configured to adjust the controllable-variable impedance component in order to modify the source impedance of the power supply system.

DETAILED DESCRIPTION

Figure 1:
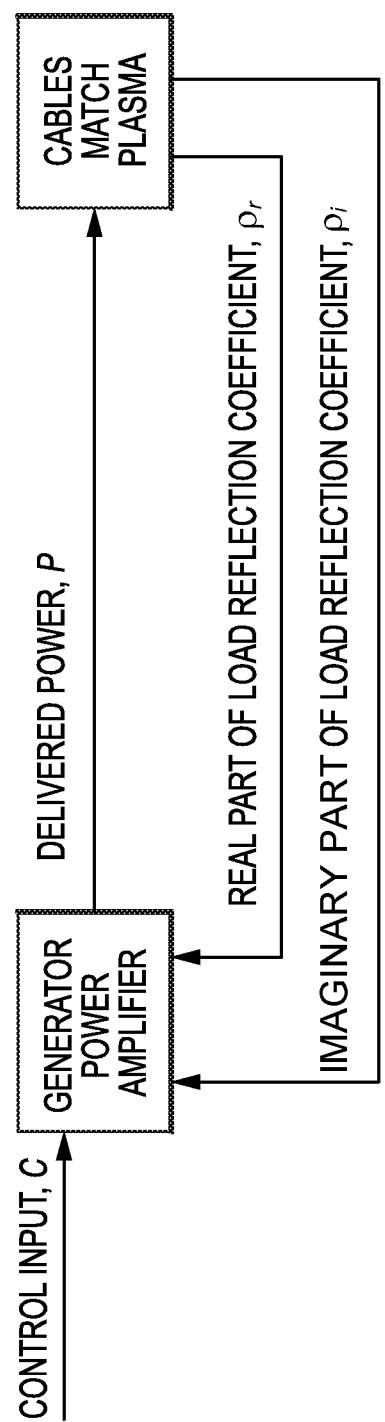
FIG. 1 is a system schematic showing generator interface to plasma.

An understanding of various embodiments of the invention is aided by an analysis of how instability in the output power of an electrical generator can occur as a result of interactions between the generator and the impedance of a nonlinear load with which it is connected. Plasma-generator interactions play a crucial role in the stability of plasma systems. This interaction can be understood by referring to FIG. 1. In general the system can be described by three equations:

$$P=\tilde{f}(C,\rho_r,\rho_i,t)$$

$$\rho_r=\tilde{g}(P,t)$$

$$\rho_i=\tilde{h}(P,t)$$

where P is the power delivered by the generator, $\rho_r$ and $\rho_i$ are the real and imaginary parts of the load reflection coefficient presented to the generator by the plasma through the match and cables, respectively, C is the control input provided to the generator power amplifier (typically drive signal amplitude, gate bias or supply voltage), and t is time.

The initial analysis can be simplified by assuming that the changes in generator power in response to a change in impedance from the plasma system happen instantaneously and similarly the change in impedance presented to the generator happen instantaneously when the power into the plasma is changed. Further assuming that the system is not time dependent, we end up with $$P=f(C,\rho_r,\rho_i)$$

$$\rho_r=g(P)$$

$$\rho_i=h(P)$$

Assuming the functions are differentiable and using a Taylor series expansion with only the first derivatives, we can linearize the three equations around the operating point to obtain $$dP =$$

$$\frac{\partial f}{\partial C}dC + \frac{\partial f}{\partial \rho_i}\frac{dg}{dP}dP + \frac{\partial f}{\partial \rho_i}\frac{dh}{dP}dP \Rightarrow \left(1 - \frac{\partial f}{\partial \rho_r}\frac{dg}{dP} - \frac{\partial f}{\partial \rho_i}\frac{dh}{dP}\right)dp =$$

$$\frac{\partial f}{\partial C}dC \Rightarrow \frac{dP}{dC} = \frac{1}{1 - \frac{\partial f}{\partial \rho_r}\frac{dg}{dP} - \frac{\partial f}{\partial \rho_i}\frac{dh}{dP}}\frac{\partial f}{\partial C}.$$

This means that the control input to power output of the generator power amplifier is modified by $$\frac{1}{1 - \frac{\partial f}{\partial \rho_r}\frac{dg}{dP} - \frac{\partial f}{\partial \rho_i}\frac{dh}{dP}}.$$

The denominator of this multiplier is $$1 - \frac{\partial f}{\partial \rho_r}\frac{dg}{dP} - \frac{\partial f}{\partial \rho_i}\frac{dh}{dP}$$

which is 1 minus the inner product of the vectors $$S_G \equiv \left(\frac{\partial f}{\partial \rho_r}, \frac{\partial f}{\partial \rho_i}\right), \text{ and } S_L \equiv \left(\frac{dg}{dP}, \frac{dh}{dP}\right).$$

The first vector, $S_G$, is the sensitivity of the generator to changes in load impedance (expressed as a reflection coefficient) and the second vector, $S_L$, describes the sensitivity of the nonlinear load impedance to changes in generator power.

Since the gain of the generator power amplifier with respect to the control input approaches infinity as the inner product approaches 1, an increase in the inner product can lead to a generator control system instability due to erosion of the gain and phase margins in the generator control loop. As long as the inner product is less than 1, a drop in control loop gain can compensate for the increase in control input to power output of the power amplifier. However, as soon as the inner product is larger than 1, the sign of the control input to power output reverses, and no modification of the control loop gain can restore stability. As disclosed in U.S. Pat. No. 7,570,028, a control system that also uses information about the load impedance can operate in a stable fashion under these conditions. Furthermore, it is interesting that even though the gain at DC may be inverted, with the appropriate high frequency response considered in the more detailed analysis to follow, the system may be controllable and stable using a simple integrator in the loop.

Figure 2:
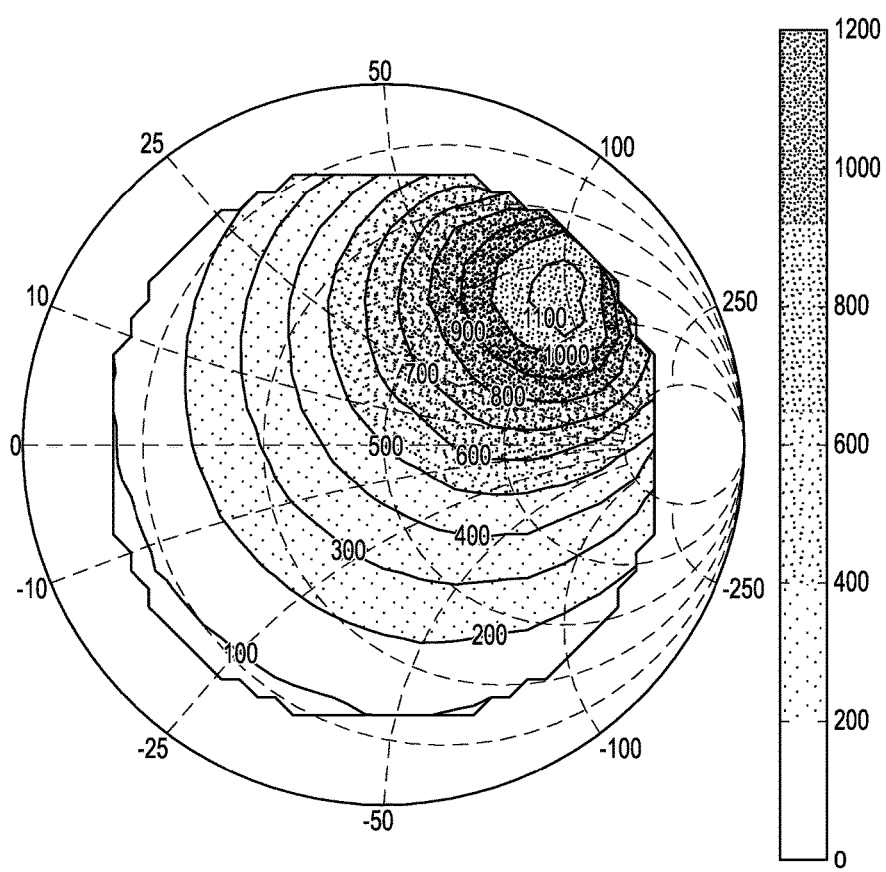
FIG. 2 is a plot of delivered power as a function of load impedance plotted on a Smith chart with a fixed control input.

The generator sensitivity vector $S_G$ at a specific impedance and power level can be found by adjusting the control input, C, so that the specific power is produced into the specific impedance and then varying the load impedance with the control input fixed and recording the delivered power as a function of load impedance. The vector $S_G$ at the specific power level into the specific load is then the gradient of this plot of delivered power as function of load reflection coefficient at the load reflection coefficient corresponding to the specific load impedance. FIG. 2 shows such a plot for finding $S_G$ at 500 W into 50Ω. More specifically, FIG. 2 is a plot of delivered power as a function of load impedance plotted on a Smith chart (so that the abscissa and ordinate axes correspond to the real and imaginary parts of the load reflection coefficient, respectively) with a fixed control input. The gradient of this plot evaluated at the origin is the generator sensitivity vector, $S_G$, at 500 W and into 50Ω.

Figure 3:
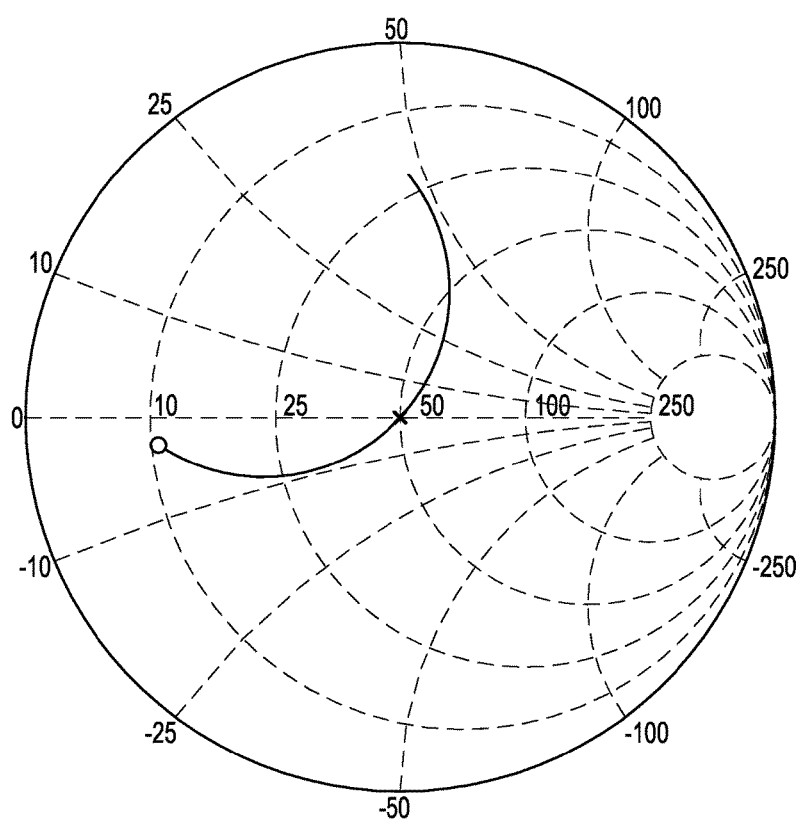
FIG. 3 is a plot of load impedance as a function of delivered power from 10 to 1000 W for a specific nonlinear load.
Figure 4:
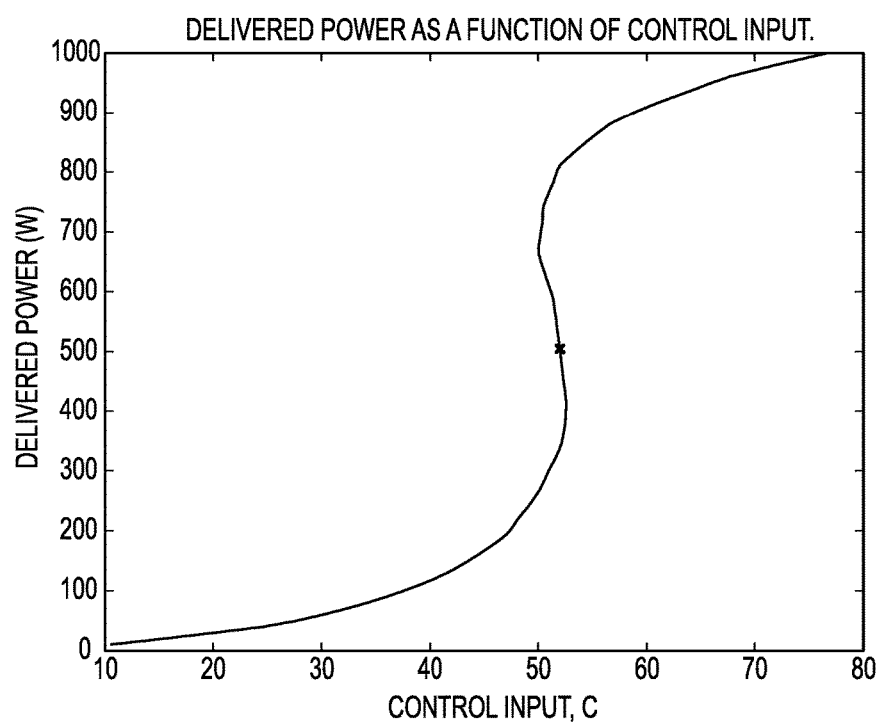
FIG. 4 is a graph depicting a control input to delivered power transfer function for a generator with characteristics corresponding to that of FIG. 2 operating into a nonlinear load with the characteristics of FIG. 3.

For a specific nonlinear load (e.g., a plasma load in a specific plasma chamber at a specific gas mixture and pressure), the load sensitivity vector, $S_L$ can be found by fixing any variable match components which may be present and varying the delivered power and recording the impedance presented to the generator as a function of delivered power. FIG. 3 shows such a plot for finding $S_L$ at 500 W (with the matching network adjusted to present 50Ω to the generator at 500 W). More specifically, FIG. 3 is a plot of load impedance as a function of delivered power from 10 to 1000 W with o corresponding to 10 W and x corresponding to 500 W for a specific nonlinear load. The tangent to the line at the origin corresponds to the load sensitivity vector $S_L$ at 500 W By solving for the required control input to achieve the specified power at each point on the trajectory of load impedance as a function of power delivered to the load, the plot of output power as a function of control input for the specific nonlinear load using the specific generator can be obtained. If the inner product is bigger than one, it can be expected that the slope, dP/dC, would be negative. FIG. 4 shows that this is indeed the case. In particular, FIG. 4 is a graph depicting a control input to delivered power transfer function for a generator with characteristics corresponding to that of FIG. 2 operating into a nonlinear load with the characteristics of FIG. 3. It should be noted that FIG. 2 shows the response of the generator at only one fixed control input. In order to construct this transfer function, the response at a continuum of control inputs must be known.

Figure 5:
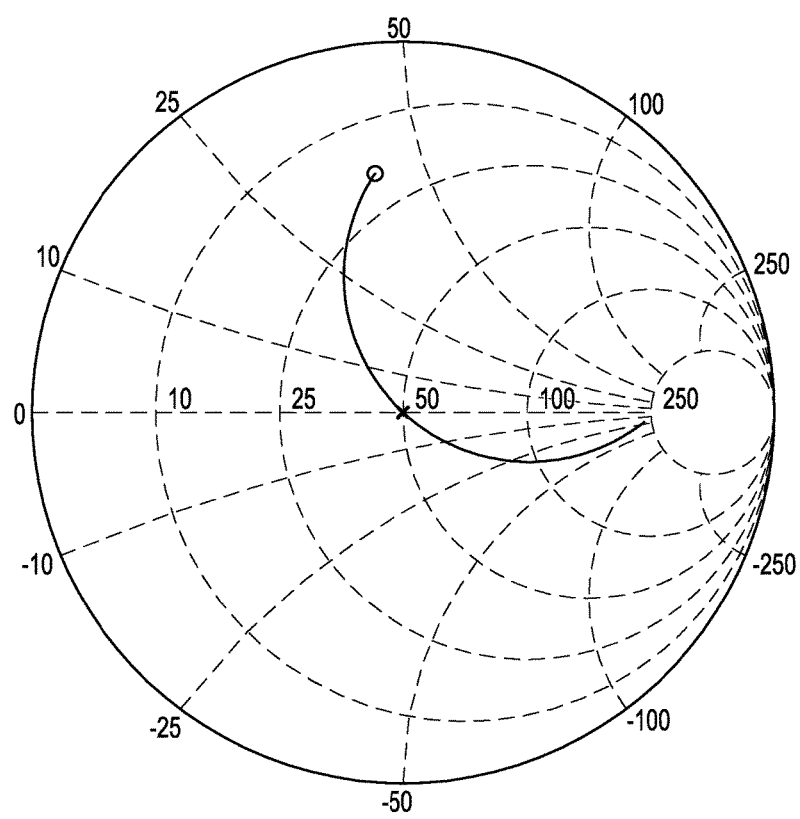
FIG. 5 is a plot of load impedance as a function of delivered power from 10 to 1000 W corresponding to the plot of FIG. 3 with an additional 50Ω cable with electrical length 45° inserted between the generator and the load.
Figure 6:
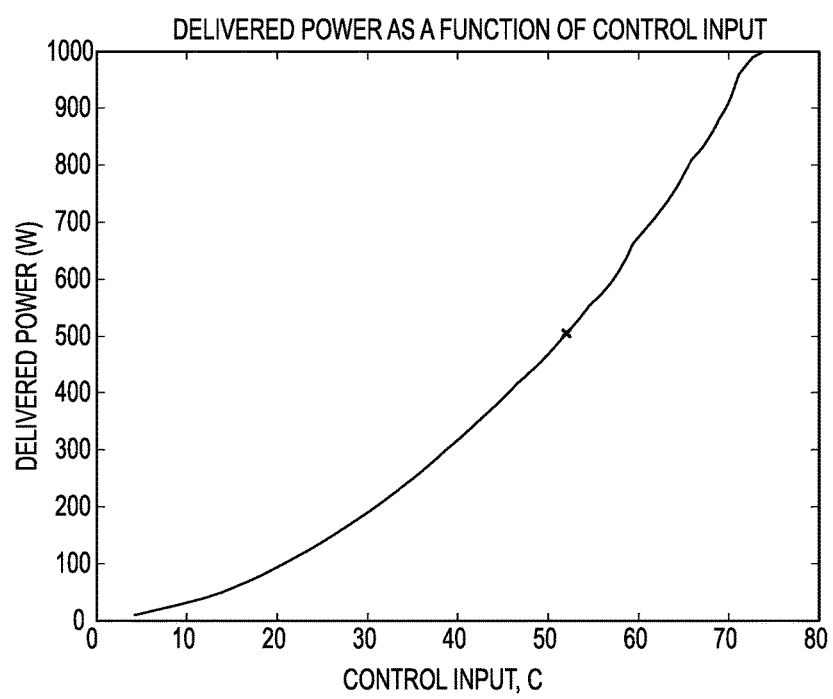
FIG. 6 is a graph depicting control input to delivered power transfer function for a generator with characteristics corresponding to that of FIG. 2 operating into a nonlinear load with the characteristics of FIG. 5.

The load sensitivity vector $S_L$ can easily be rotated by inserting an additional length of transmission line between the generator output and the load. The use of cables to rotate the load sensitivity vector to achieve stable operation is standard practice. For example, FIG. 5 shows the load presented to the generator as a function of delivered power corresponding to the load of FIG. 3 with an additional length of 50Ω cable with electrical length of 45° inserted between the generator and the load. More specifically, FIG. 5 is a plot of load impedance as a function of delivered power from 10 to 1000 W with o corresponding to 10 W and x corresponding to 500 W corresponding to the plot of FIG. 3 with an additional 50Ω cable with electrical length 45° inserted between the generator and the load. The corresponding control input to delivered power output transfer function is shown in FIG. 6, which is a graph depicting control input to delivered power transfer function for a generator with characteristics corresponding to that of FIG. 2 operating into a nonlinear load with the characteristics of FIG. 5.

Figure 7:
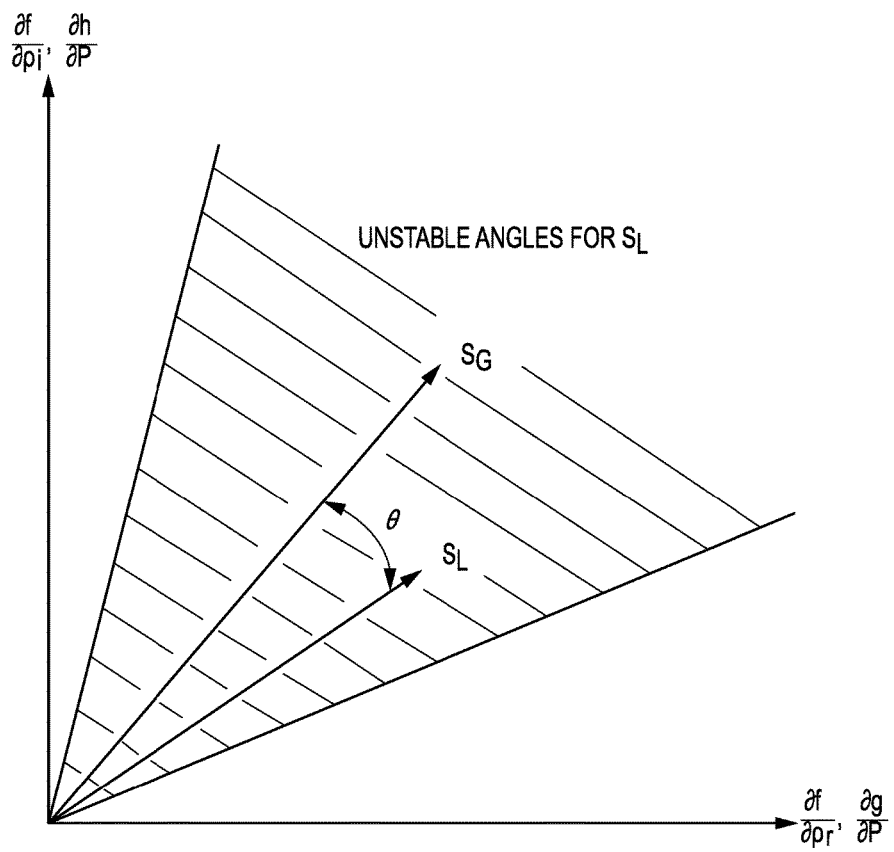
FIG. 7 is a graph depicting the generator and nonlinear load sensitivity vectors, $S_G$ and $S_L$, respectively, together with the angles of $S_L$ in relation to $S_G$ that leads to predicted instability.

Based on the simple theory above, it would appear that the unstable direction for the load sensitivity vector, $S_L$, is when it is more or less aligned with the generator sensitivity vector, $S_G$, resulting in a large positive inner product. With θ the angle between $S_G$ and $S_L$ one thus expects that the system would be stable as long as $$\frac{1}{1 - |S_G||S_L|\cos(\theta)} < M$$

where M is the increase in the gain of the control input to delivered power output that would result in an unstable control system through erosion of the gain margin. In the limiting case of infinite gain margin, $$|S_G||S_L|\cos(\theta) < 1$$

is required to prevent an inversion of the control input to delivered power slope. The stable and unstable rotations of the vector $S_L$ are graphically illustrated in FIG. 7. In particular, FIG. 7 is a graph depicting the generator and nonlinear load sensitivity vectors, $S_G$ and $S_L$, respectively, together with the angles of $S_L$ in relation to $S_G$ that leads to instability predicted by the simplified theory.

The simplified analysis with derivatives ignores the fact that there is a response over time associated with a change in inputs for both the generator and plasma subsystems. For example, the derivative $\partial_P/\partial_C$ is the small signal transfer function of the control input (drive level, gate bias, rail voltage etc.) to delivered power output from the generator, provided the load impedance remains fixed. Clearly there is a frequency response associated with this transfer function (as opposed to a flat frequency response assumed by the simplified analysis). Similarly, there is a frequency response associated with each of the other derivatives appearing in the term modifying the control to delivered power response when there is interaction between the generator and plasma subsystems.

The total linearized transfer function from control input to delivered power output of the generator power amplifier in the frequency domain is thus better described by:

$$H(\omega) = \frac{1}{1 - PdR(\omega).RdP(\omega) - PdX(\omega).XdP(\omega)} PdC(\omega)$$

where PdR is the linearized small signal transfer function from a change in load resistance to a change in delivered power for the generator power amplifier, RdP is the linearized small signal transfer function from a change in delivered power to a change in resistance presented to the generator for the plasma subsystem, PdX is the linearized small signal transfer function from a change in load reactance to a change in delivered power for the generator power amplifier, XdP is the linearized small signal transfer function from a change in delivered power to a change in reactance presented to the generator for the plasma subsystem, and PdC is the linearized small signal transfer function from a change in control input to a change in delivered power for the generator power amplifier where PdR, RdP, PdX, XdP, and PdC are the linearized transfer functions assuming that all variables except resistance, reactance, delivered power, delivered power and control input, respectively, remain constant.

To illustrate the effect of the more complete analysis, assume that the control input to delivered power output of the generator in the Laplace domain is $$H(s) = \frac{1}{1 - k\frac{|a|^2}{(s+a)(s+a^*)}\frac{b}{s+b}} PdC(s)$$

where PdC(s) is the linearized small signal transfer function from a change in control input to a change in delivered power for the generator power amplifier in the Laplace domain, k is the inner product $\langle S_G, S_L \rangle$ at DC and $$\frac{|a|^2}{(s+a)(s+a^*)}\frac{b}{s+b}$$

represents the dynamic response of the interaction between the generator and nonlinear load. To further simplify the analysis, assume that PdC(s)=1 and consider the closed loop poles of the setpoint to delivered power transfer function when the power amplifier is used in a closed loop control system with a single integrator in the loop and unity loop gain is at 2 kHz when k=0 as shown in FIG. 8.

Figure 8:
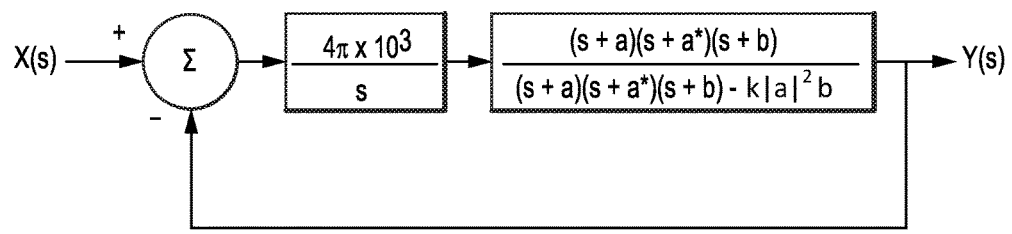
FIG. 8 is a control diagram depicting a closed loop control system to illustrate a more detailed analysis.

From FIG. 8 it is clear that the closed loop transfer function is $$\frac{Y(s)}{X(s)} = \frac{4\pi \times 10^3(s+a)(s+a^*)(s+b)}{s[(s+a)(s+a^*)(s+b) - k|a|^2b] + 4\pi \times 10^3(s+a)(s+a^*)(s+b)}.$$

If k is exactly zero, the transfer function becomes $$\frac{Y(s)}{X(s)} = \frac{4\pi \times 10^3}{s + 4\pi \times 10^3},$$

with a single pole at $-4\pi \times 10^3$, otherwise the poles of the closed loop transfer function are the zeros of $$s[(s+a)(a+a^*)(a+b) - k|a|^2b] + 4\pi \times 10^3(s+a)(s+a^*)(s+b)$$

It should be noted that as k approaches 0, the residues of the high frequency poles approach zero and thus the high frequency poles do not dramatically affect the closed loop response if |k| is small and all poles are in the left half of the complex plane.

Figure 9:
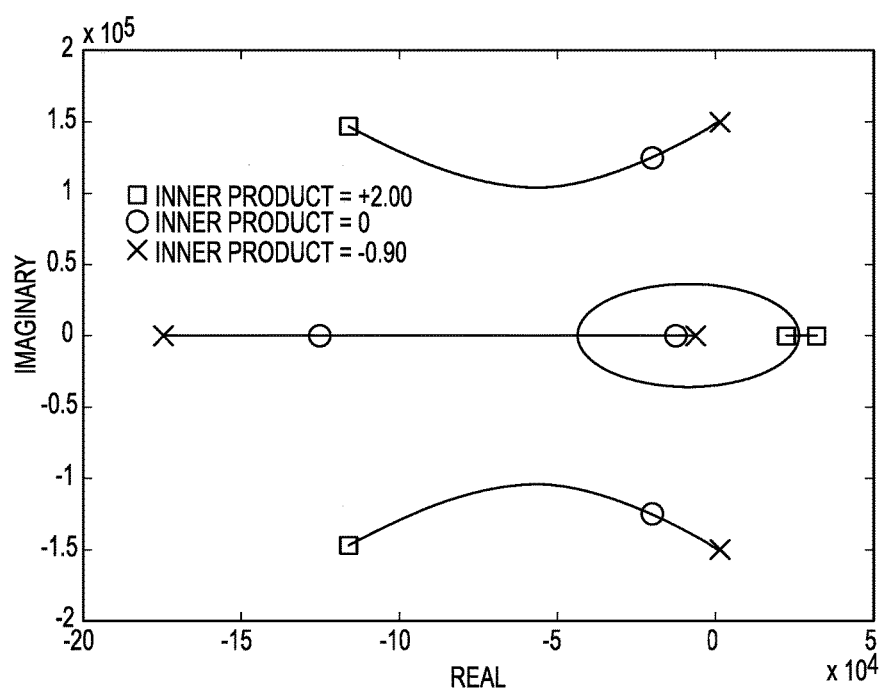
FIG. 9 shows closed loop pole locations as a function of the DC value of the inner product $(S_G, S_L)$ assuming single integrator closed loop control with unity loop gain at 2 kHz when the DC value of $(S_G, S_L)$ is zero.

Assuming that for a specific power amplifier the response of the amplifier delivered power to a modulated load impedance is approximated by a single pole at around 20 kHz ($b = 2\pi \times 20 \times 10^3 \approx 1.25 \times 10^3$), and the plasma response to a modulated power level is approximated by a complex pole pair at $-20 \times 10^3 \pm 125 \times 10^3 j$ ($a = 20 \times 10^3 \mp 125 \times 10^3 j$), the location of the closed loop poles as a function of k, the DC value of the inner product $\langle S_G, S_L \rangle$, is shown in FIG. 9, which depicts closed loop pole locations as a function of the DC value of the inner product $\langle S_G, S_L \rangle$ assuming single integrator closed loop control with unity loop gain at 2 kHz when the DC value of $\langle S_G, S_L \rangle$ is zero. Here the dynamic response of the generator-plasma interaction is assumed to have a pole at $-125 \times 10^3$ and a complex pole pair at $-20 \times 10^3 \mp 125 \times 10^3 j$.

The behavior of the closed loop poles in FIG. 9 as a function of the DC value of the inner product $\langle S_G, S_L \rangle$ can be summarized as follows:

| DC value of $(S_G, S_L)$, k | Behavior |
|---|---|
| k > 1.03 | Unstable with natural frequency magnitude around 5.4 kHz |
| −0.82 < k ≤ 1.03 | Stable |
| k ≤ −0.82 | Unstable with natural frequency magnitude around 27 kHz |

If the pole assumed to be around 20 kHz in the above analysis is changed to a lower frequency of 800 Hz, stability is maintained over a much larger range of inner product values.

Figure 10:
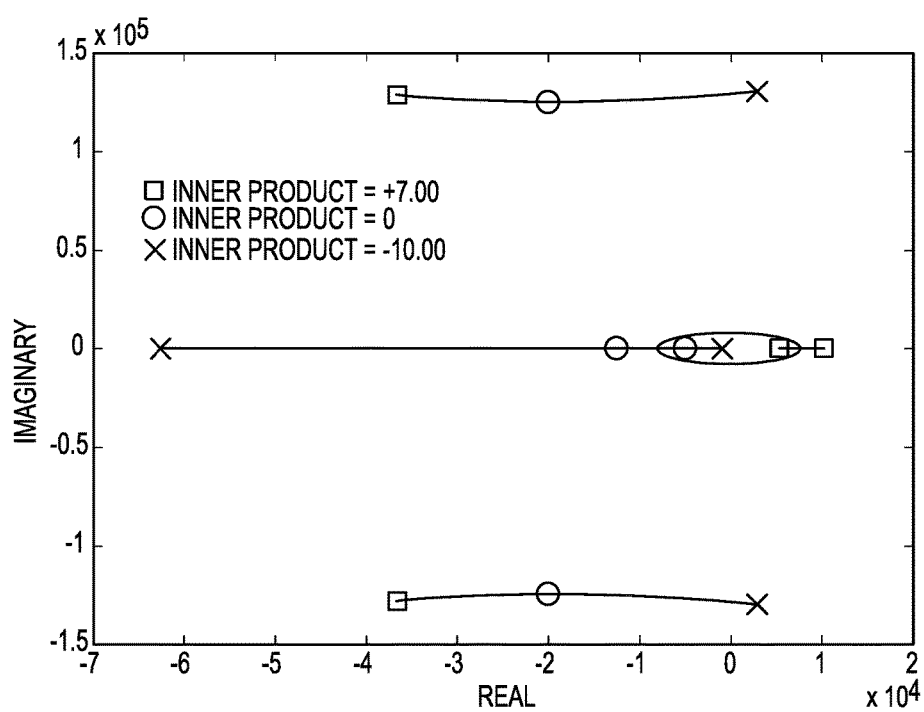
FIG. 10 shows closed loop pole locations as a function of the DC value of the inner product $(S_G, S_L)$ assuming single integrator closed loop control with unity loop gain at 2 kHz when the DC value of $(S_G, S_L)$ is zero.

FIG. 10 shows the closed loop pole locations as a function of the DC value of the inner product $\langle S_G, S_L \rangle$ assuming b=5000 and all other parameters are the same as those considered in FIG. 9.

The behavior of the closed loop poles in FIG. 10 as a function of the DC value of the inner product $\langle S_G, S_L \rangle$ can be summarized as follows:

| DC value of $(S_G, S_L)$, k | Behavior |
|---|---|
| k > 3.5 | Unstable with natural frequency magnitude around 1.2 kHz |
| −8.5 < k ≤ 3.5 | Stable |
| k ≤ −8.5 | Unstable with natural frequency magnitude around 20.6 kHz |

Note the counter-intuitive result that the system remains stable even though the DC value of the inner product $\langle S_G, S_L \rangle$ is bigger than one resulting in a sign change in the control input to delivered power output at DC. The system only goes unstable once the inner product exceeds 3.5.

Even though the analysis presented here is greatly simplified, the extension of the analysis to include the dynamic behavior of the interactions correspond much better to the observed behavior of RF generators on plasma systems. Specifically, the stable angles of $S_L$ with respect to $S_G$ is observed to be around −90° and +90° with unstable behavior both when $S_L$ and $S_G$ are aligned and when the angle between $S_G$ and $S_L$ is around 180°. Furthermore, the shift in frequency between a low frequency oscillation when $S_G$ and $S_L$ are aligned and a high oscillation frequency when $S_G$ and $S_L$ are opposing is clearly observed. The existence of a high frequency pole in the response of typical generators to a modulated load impedance had been confirmed through circuit analysis and the existence of a complex pole pair in the response of plasma systems has been confirmed using a stepped change in power using a linear generator and observing an underdamped response of the plasma impedance.

Observed behavior. From the analysis presented above, it can be concluded that meeting one of the following three conditions is sufficient to ensure stability:

1. the magnitude of the generator sensitivity vector, $|S_G|$, is small
2. the magnitude of the plasma sensitivity vector, $|S_L|$, is small
3. $S_G$ is approximately perpendicular to $S_L$.

Of the three conditions noted above, only a small $|S_G|$ is completely under control of the generator designer. In most plasma systems, an impedance matching network located close to the plasma transforms the plasma impedance to an impedance matched to the characteristic impedance of the cable or transmission line connecting the impedance matching network to the generator, typically 50Ω. For the rest of the discussion assume that this impedance is 50Ω since it is the dominant choice.

For a generator with a source impedance equal to 50Ω, $|S_G|$ is indeed zero for a 50Ω load. There are a number of techniques for designing generators with a 50Ω source impedance. Class A/B generators can generally be designed to have a 50Ω source impedance at the expense of efficiency. Balanced amplifiers provide a way of combining high efficiency (typically class D or E) amplifiers and still have a 50Ω source impedance at the expense of power sharing between the two amplifiers making up the balanced amplifier when the load impedance moves off 50Ω.

Figure 11:
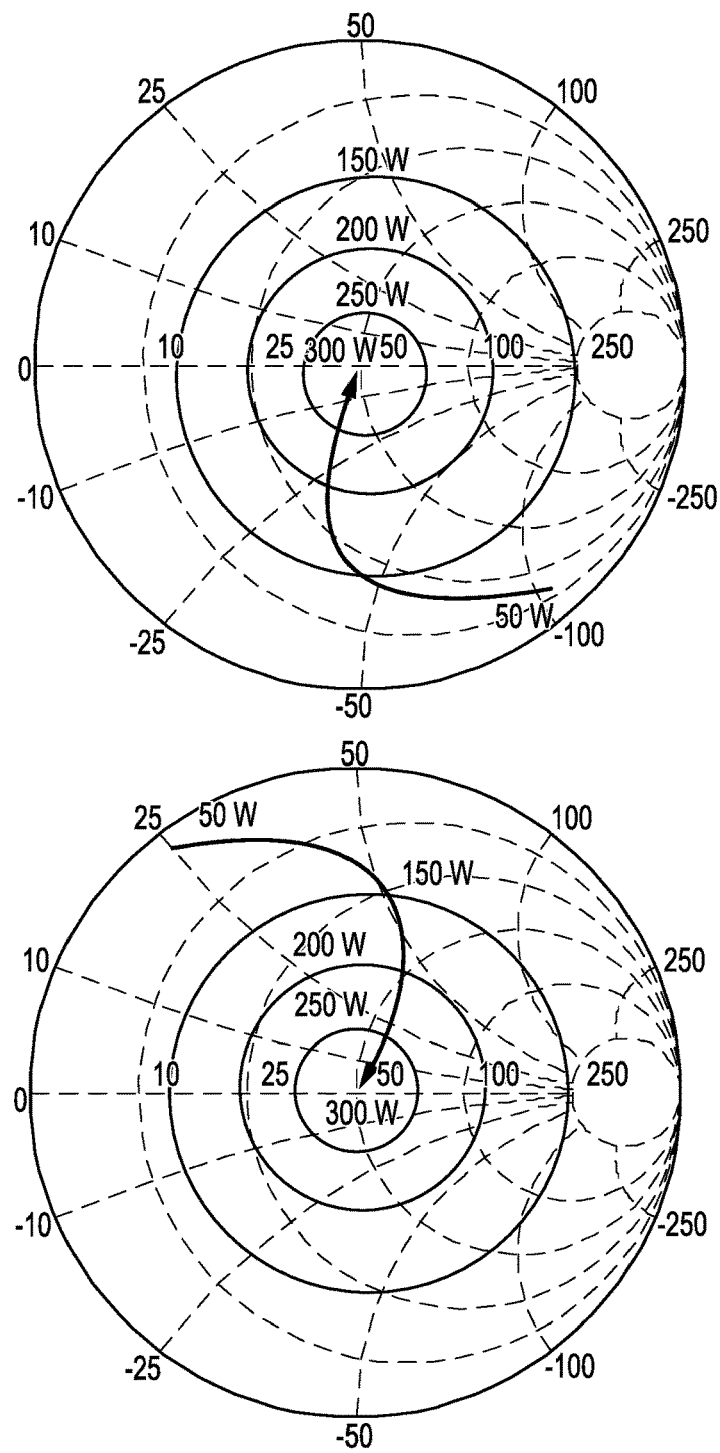
FIG. 11 is an open loop power profile of a 50Ω source impedance generator together with a trajectory of plasma impedance versus plasma power for two different cable lengths between the generator and impedance matching network at the plasma.

It may be assumed, and this has long been believed, that a generator with a 50Ω source impedance is the best type of generator to use on a plasma system since stability should be assured provided the matching network matches the plasma impedance to 50Ω. However experimental results show that a generator with a mismatched source impedance that is properly aligned with the plasma impedance versus power trajectory is more stable than a generator with a 50Ω source impedance, even if the plasma impedance is matched to 50Ω. To understand this observation, reference is made to FIG. 11, which shows the open loop power profile of a 50Ω source impedance generator together with the impedance vs. power trajectory of a plasma system for two different cable lengths between generator and impedance matching network for the same plasma. As soon as the plasma impedance reaches 50Ω, $|S_G|$ is zero, but note that everywhere else the inner product $\langle S_G, S_L \rangle$ is not zero because the trajectory of plasma impedance crosses the open loop power profile contour lines. What this means is that once the system operates in a stable fashion at 50Ω it is unlikely to go unstable, but if the system is perturbed it can enter a large signal instability. Furthermore, no change in cable length inserted between the generator and the matching network at the plasma can change $\langle S_G, S_L \rangle$ as a function of plasma power since the power profile is circular. It should be noted that in practice second order effects including the already noted dynamic nature of the interaction can result in changes in behavior as cable length is changed.

Figure 12:
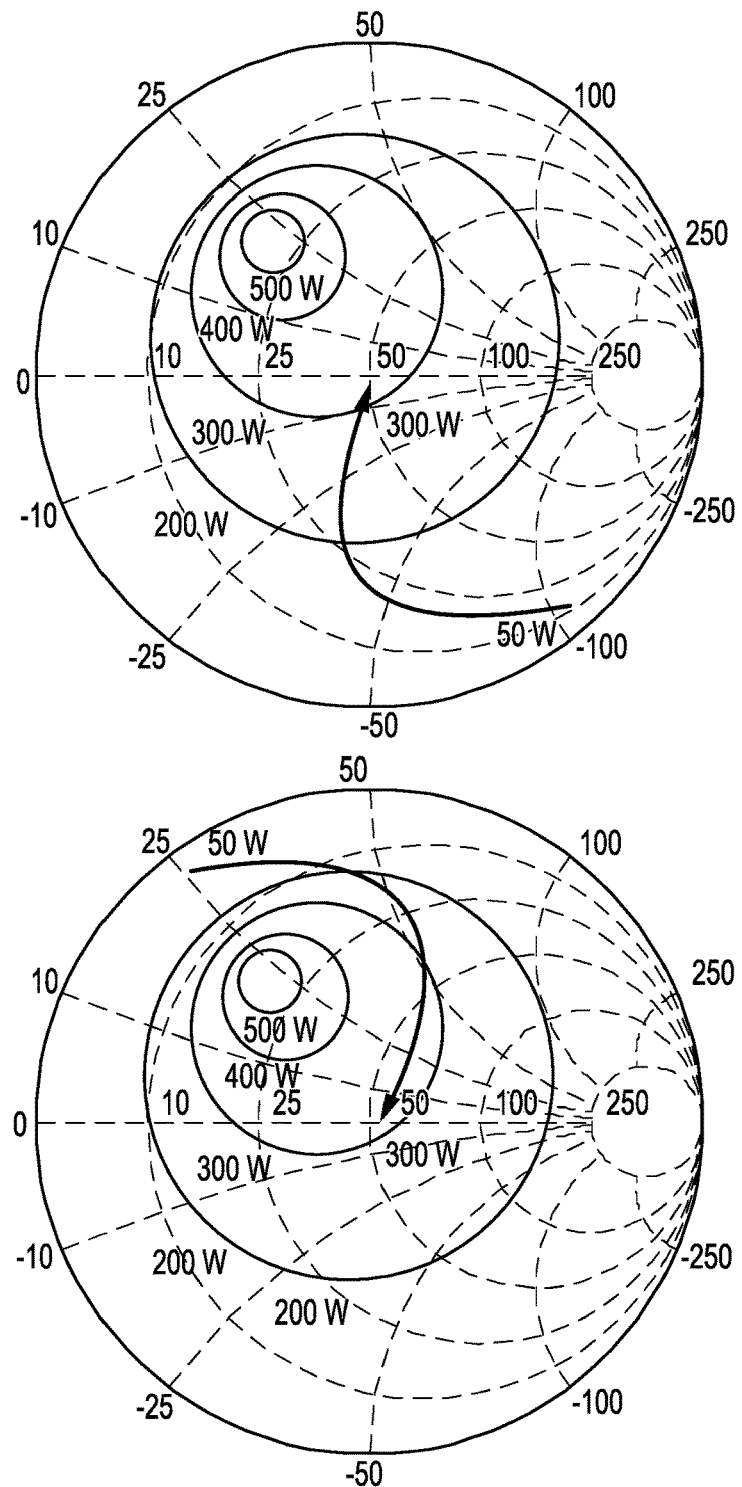
FIG. 12 is an open loop power profile of a non-50Ω source impedance generator together with a trajectory of plasma impedance vs. plasma power for two different cable lengths between the generator and impedance matching network at the plasma.

Referring next to FIG. 12, it includes Smith charts depicting an open loop power profile of a non-50Ω (20–j20Ω) source impedance generator together with a trajectory of plasma impedance versus plasma power for two different cable lengths between the generator and impedance matching network at the plasma. It is noted that by using a non-50Ω source impedance generator and an appropriate cable length between the generator and the matching network at the plasma, it is possible to get $\langle S_G, S_L \rangle = 0$ at 50Ω. But unlike the 50Ω source impedance generator, it is also possible to approximately align the plasma impedance trajectory with the contour lines of the open loop power profile of the generator. This makes this system less susceptible to perturbations and results in a more stable system. The drawback of a system such as this is that the same generator, cable, and matching network is often used to drive different plasmas (e.g., different gas mixtures and different pressures) and with a fixed cable length it is difficult to get the system stable for all plasmas.

A simple solution is to simply tune the tuner to an impedance different than 50Ω. The problem with this approach is that many customers do not want to see any reflected power measured by the generator as would result from tuning to another impedance, and the generator may not be able to deliver the requisite power or maintain the required delivered power accuracy into a non-50Ω load. Another problem is that many high efficiency generators (e.g., class D or E) have source impedances that are highly mismatched to 50Ω resulting in large $|S_G|$ making it very difficult to find the correct cable length to stabilize the system for all plasmas that the system must drive.

What is required is control over the generator source impedance and a method for easily rotating the plasma impedance trajectory to align with the generator open loop power profile contours. Both can be achieved if one has arbitrary control over the generator source impedance. A way of achieving almost arbitrary control is disclosed below.

Another option is to deliberately offset the generator source impedance a convenient amount and electronically rotate the plasma impedance versus power trajectory as seen by the generator.

Plasma Ignition.

If the source impedance of the generator is matched to the impedance presented to the generator by the plasma system, maximum power is delivered in the matched state. Prior to ignition, the impedance presented to the generator is different from the impedance presented to the generator once the plasma is lit. With a matched source impedance, this means that the generator can deliver less power to the unlit plasma than to the lit plasma which may inhibit plasma ignition.

Deliberately offsetting the generator source impedance can allow the generator to deliver more power during ignition. This offset source impedance may not be the desired source impedance for stability of the plasma system so it may be desirable to switch to a different source impedance once the plasma is lit. This can be done with varying the source impedance in a continuous fashion or switching between different preset source impedances.

Pulse Shape Control.

If pulsed power is applied to a typical plasma load, the impedance presented to the generator varies as a function of time. If the generator source impedance is 50Ω, forward power measured with respect to 50Ω (as would be measured with a 50Ω directional coupler) is independent of load impedance and in this case forward power remains constant over the duration of the pulse even as the load impedance varies over time (assuming no modulation by the generator control system). This pulse shape is visually appealing and often considered good, but it typically means that delivered power at the start of the pulse is low and increases towards the end of the pulse where the load impedance is typically matched to 50Ω. Such low delivered power at the start of a pulse can in some cases be problematic. Changing the generator source impedance away from 50Ω can improve power delivery at the start of the pulse at the expense of a square forward power pulse shape and may be beneficial. Control over generator source impedance thus provides a limited but useful means of controlling pulse shape for pulsed power systems.

A Method for Controlling the Source Impedance High Efficiency Generators.

At some power levels it is possible to manipulate a power amplifier with more than one control input to produce the same power with different open loop power profiles. This gives some control over $S_G$ and can actually be highly effective. Such a method is disclosed in U.S. Pat. No. 8,258,874.

Disclosed herein are different methods of controlling the source impedance of a generator that can be used at a variety of power levels.

Figure 13:
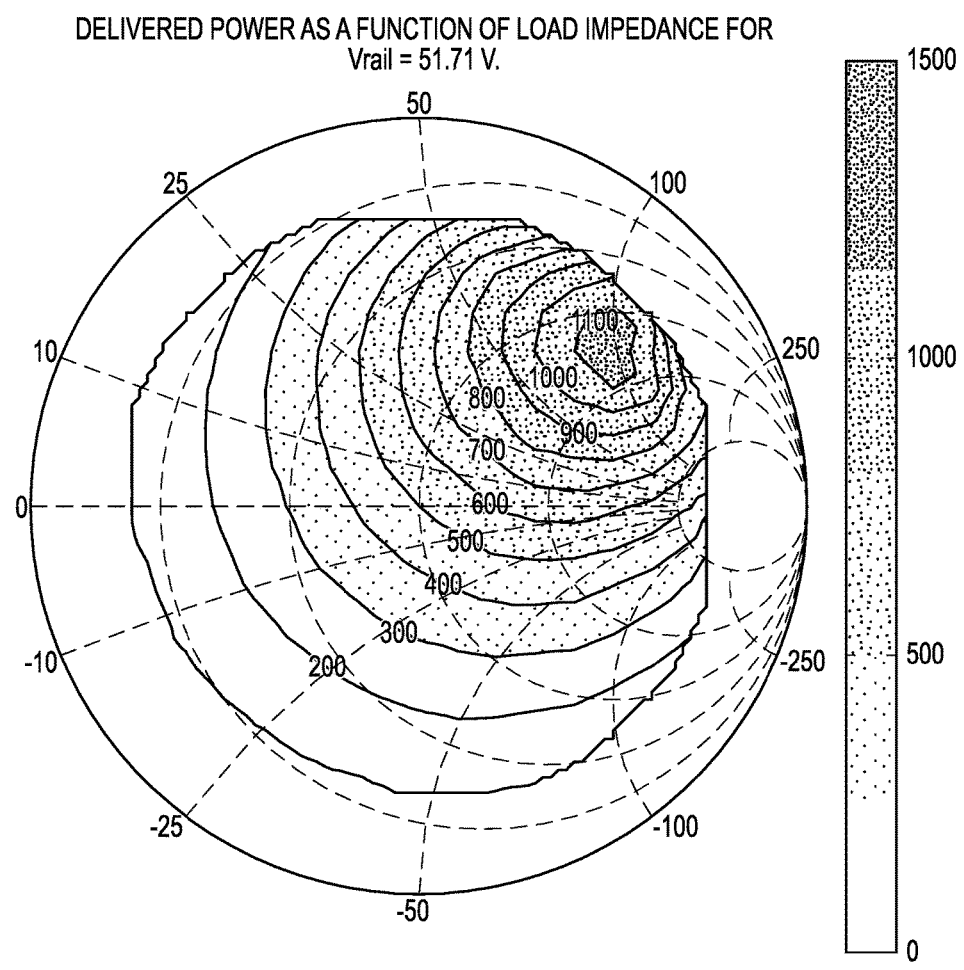
FIG. 13 depicts measured delivered power of a representative industrial power amplifier as a function of load impedance plotted on a Smith chart.
Figure 14:
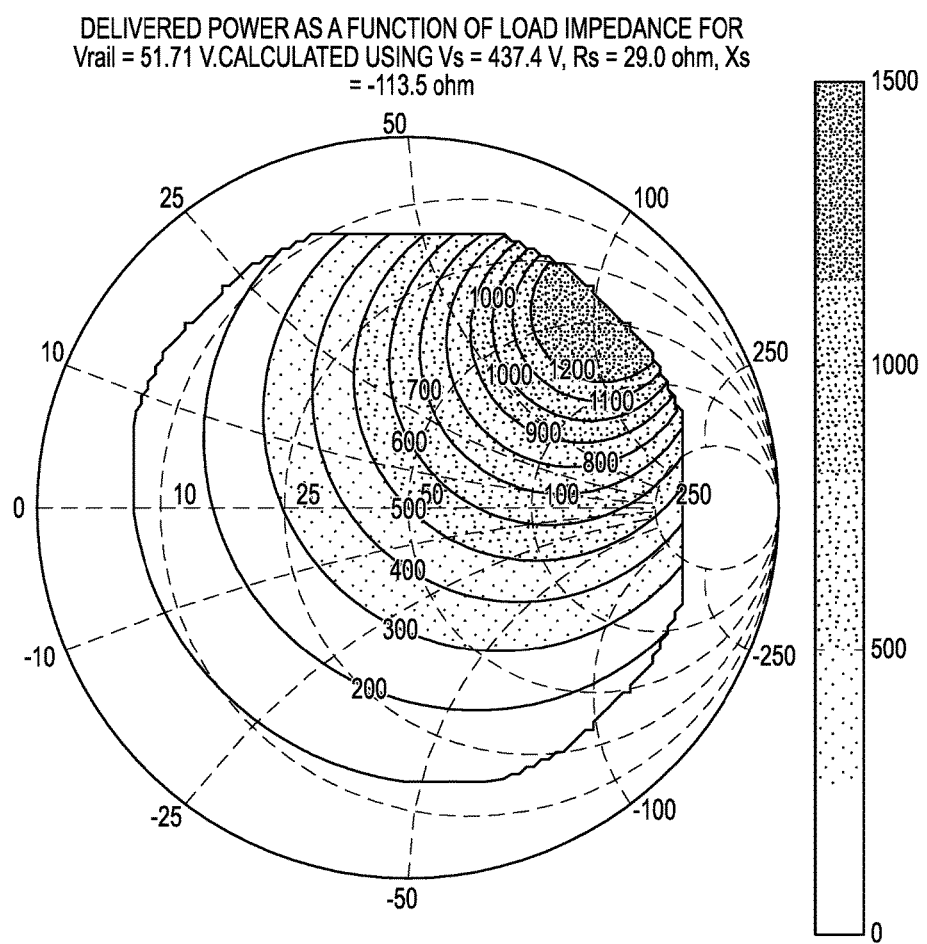
FIG. 14 shows predicted delivered power of the representative industrial power amplifier of FIG. 13 as a function of load impedance plotted on a Smith chart using a Thévenin equivalent source of 437 volt and 29−j114Ω.
Figure 15:
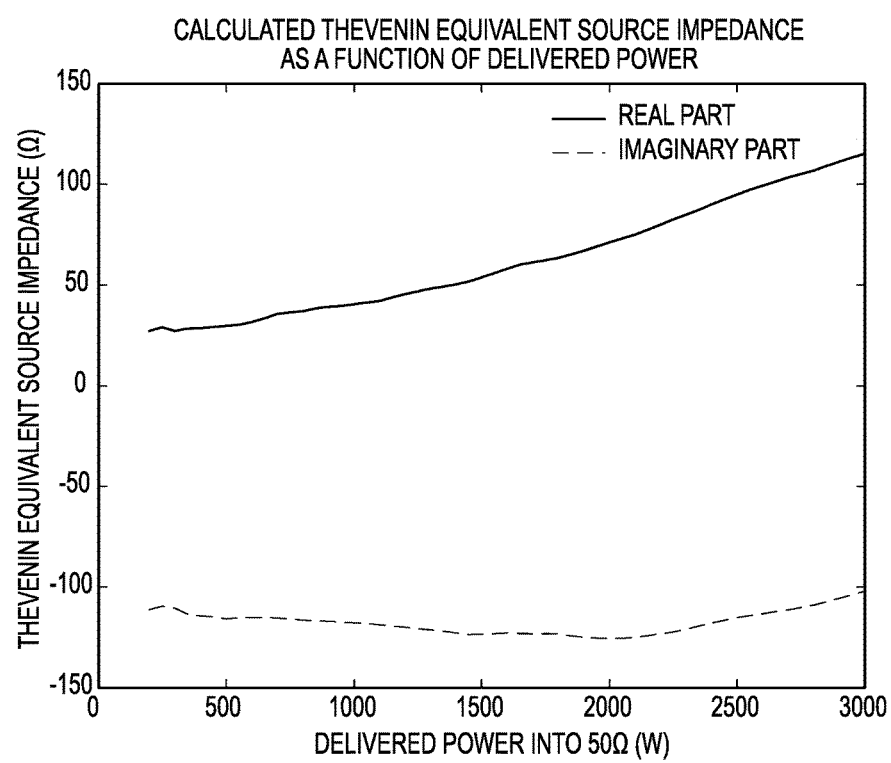
FIG. 15 is a Thévenin equivalent source impedance as a function of delivered power into a 50Ω load for a representative power amplifier.
Figure 16:
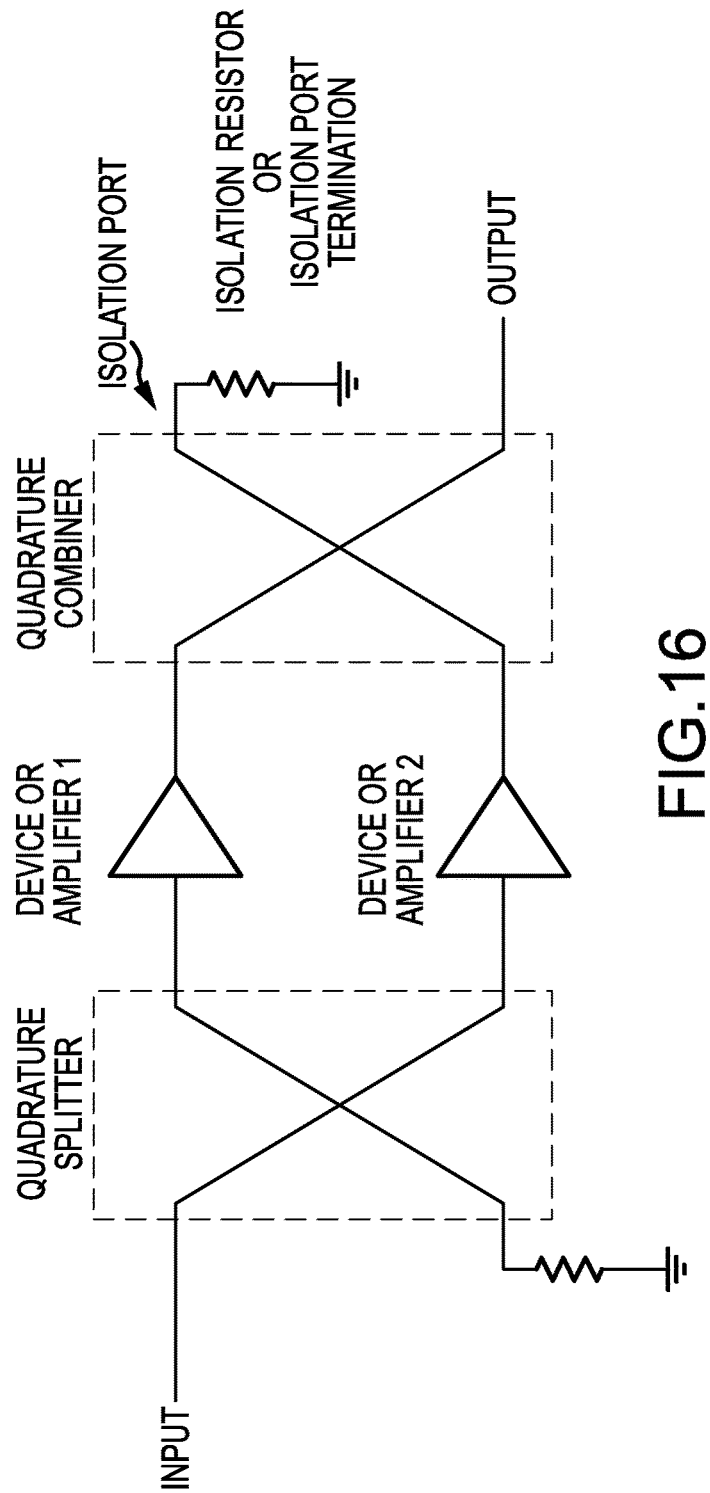
FIG. 16 is a schematic diagram depicting a balanced amplifier.
Figure 17A:
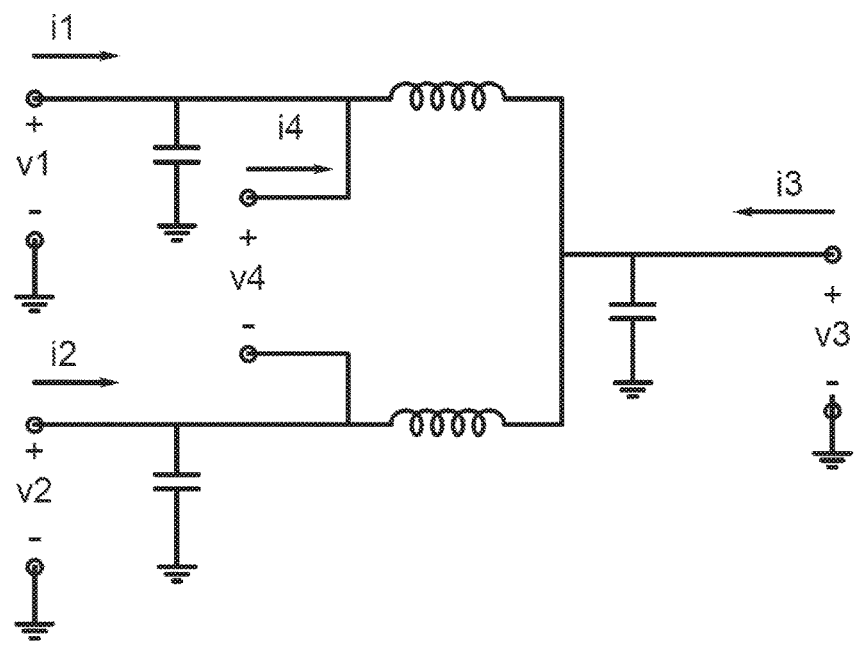
FIG. 17A is a schematic depicting an implementation of a four port combiner.
Figure 17B:
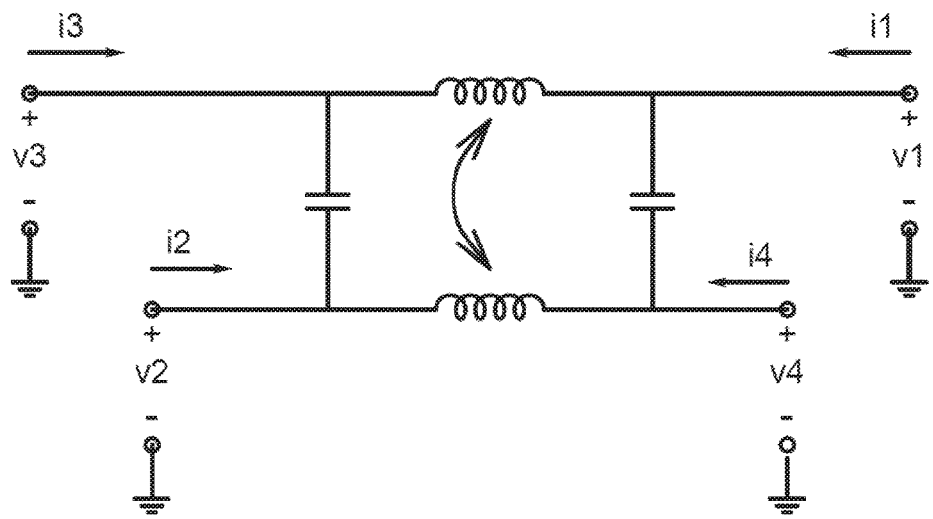
FIG. 17B is a schematic depicting another implementation of a four port combiner.

First it should be noted that it is not obvious that the open loop performance of high efficiency amplifiers can be described in the simple terms of a Thévenin equivalent source. Experimental results show that this is indeed the case as illustrated in FIGS. 13-15. FIG. 13 for example, depicts measured delivered power of a representative industrial power amplifier as a function of load impedance plotted on a Smith chart, and FIG. 14 shows predicted delivered power of the representative industrial power amplifier of FIG. 13 as a function of load impedance plotted on a Smith chart using a Thévenin equivalent source of 437 volt and 29−j114Ω. FIG. 15 is a Thévenin equivalent source impedance as a function of delivered power into a 50Ω load for a representative power amplifier;

The balanced amplifier depicted in FIG. 16 is one way of constructing an (that includes at least two constituent amplifiers) with a matched (usually 50Ω) source impedance using two identical power amplifiers disposed between a quadrature splitter and combiner. When such a balanced amplifier operates into a 50Ω load (assuming the balanced amplifier is designed to operate into 50Ω), no power is dissipated in the isolation resistor (which is an implementation of a termination impedance) of the quadrature combiner. The isolation resistor typically cannot be removed completely from the circuit as it will usually result in a resonant circuit dramatically increasing losses, but it can be replaced with a different impedance as long as the mentioned resonance is avoided. Since no power is dissipated in the resistor when the balanced amplifier operates into 50Ω, replacing it with a different impedance has no effect on operation into 50Ω. FIG. 17A and FIG. 17B show two examples of four port combiners that can be used in the construction of a balanced amplifier. The combiner of FIG. 17A is an in-phase combiner. In phase combiners in conjunction with 90-degree phase shifters can be used in the construction of a balanced amplifier as depicted in FIG. 16. In FIG. 17A the port associated with the port voltage v1 and port current i1 can be an input port, the port associated with v2 and i2 another input port, the port associated with v3 and i3 an output port and the port associated with v4 and i4 an isolation port.

The combiner of FIG. 17B is a quadrature combiner. In FIG. 17B the port associated with v1 and i1 can be an input port, the port associated with v2 and i2 another input port, the port associated with v3 and i3 an output port and the port associated with v4 and i4 an isolation port. When the combiner ports of FIG. 17B is used in this way the voltage v1 leads the voltage v2 by 90 degrees. Notice that because of symmetry, if v2 should lead v1, then the roles of the isolation and output ports interchange. Under normal conditions almost all of the total power delivered to the combiner at the two input ports is delivered to the output port and almost no power is directed to the isolation port.

If the individual amplifiers are mismatched (as is the case for high efficiency amplifiers), replacing the isolation resistor with a different impedance changes the effective source impedance of the combined amplifier. In fact, if the individual amplifiers have zero source impedances (voltage sources) or infinite source impedances (current sources) the impedance of the isolation port termination (replacing the isolation resistor in FIG. 16) becomes the source impedance of the composite amplifier; if the individual amplifiers have purely reactive source impedances, the reflection coefficient corresponding to the dump port termination is a rotation of the reflection coefficient corresponding to the source impedance of the composite amplifier.

If the source impedance of the individual amplifiers are matched to the system impedance (typically 50Ω), no power is directed to the isolation port of the combiner and changing the isolation port termination impedance has no effect on the source impedance of the composite amplifier which will be equal to the system impedance.

In some embodiments, the combiners have the property that when the plasma load is matched to the designed load impedance of the combiner and the impedance in which the isolation port is terminated is equal to the designed termination impedance and the first and second signals from the respective amplifiers have the designed amplitude and phase relationship, more than 80% of the total power supplied to the combiner by the first and second signals is delivered to the matched load connected to the output of the combiner and less than 20% of the total power supplied by the first and second signals is delivered to the isolation port termination; and when the phase of one of the input signals is shifted by 180 degrees with everything else left unchanged, more than 80% of the total power supplied to the combiner by the first and second signals is delivered to the isolation port termination and less than 20% of the total power supplied to the combiner by the first and second signals is delivered to the matched load connected to the output.

For practical high efficiency amplifiers where the source impedance of the individual amplifiers are partially mismatched to the system impedance, some control of the source impedance of the composite amplifier through changing the isolation port termination impedance is possible. It is of course always possible to make the source impedance equal to the system impedance as is the case for a regular balanced amplifier, but in addition the source impedance can be altered within certain bounds.

Figure 18:
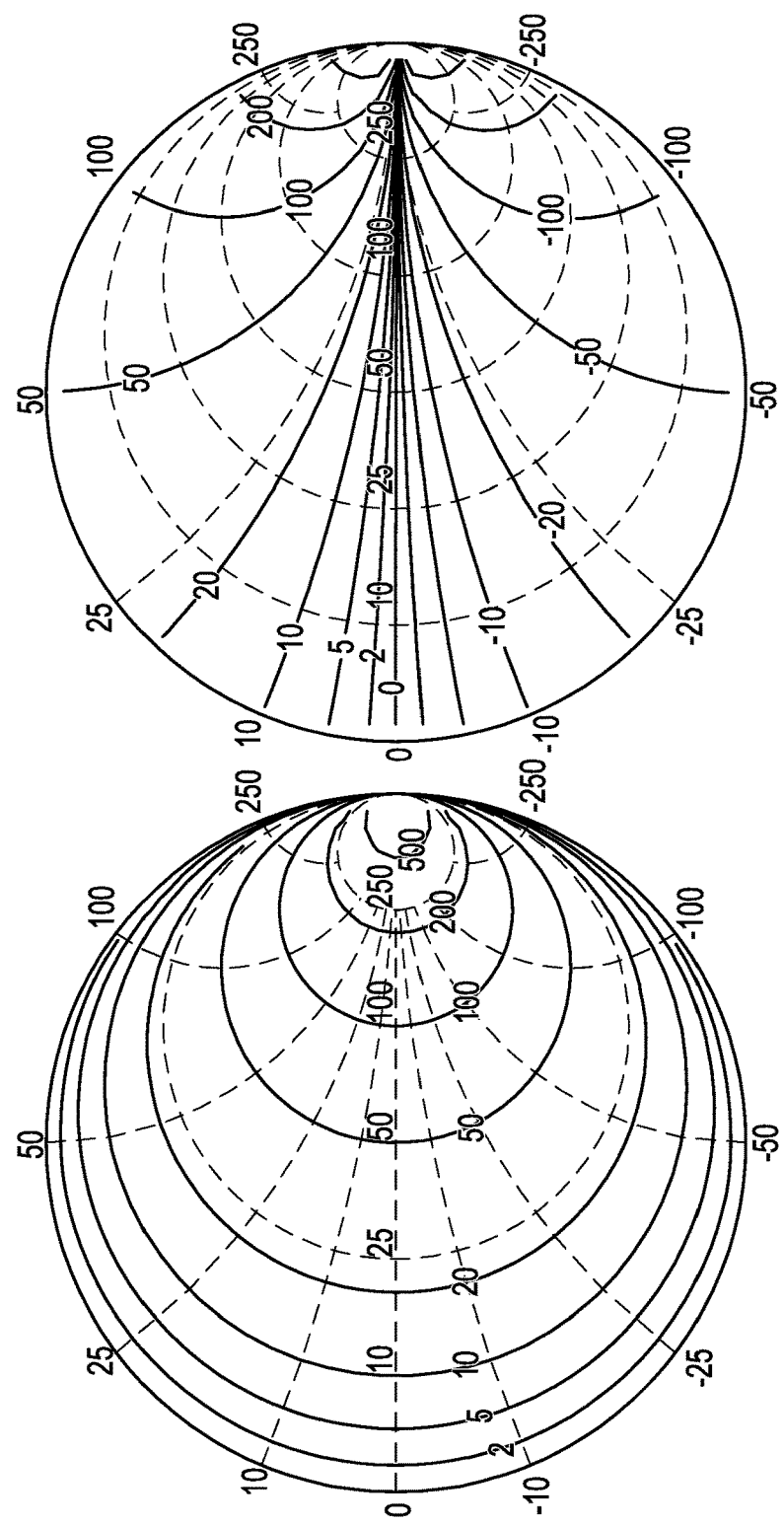
FIG. 18 shows the source impedance of the composite amplifier as a function of the isolation port (also commonly referred to as the isolated port) termination impedance if the source impedances of the individual power amplifiers making up the composite amplifier are zero.

FIG. 18 shows the source impedance of the composite amplifier as a function of the isolation port termination impedance if the source impedances of the individual power amplifiers making up the composite amplifier are zero. The real part of the source impedance is on the left, and the imaginary part on the right. On each graph the origin is in the center, the abscissa is the real part, and the ordinate the imaginary part, respectively, of the reflection coefficient with respect to 50Ω of the isolation port termination impedance. The fact that the contour maps perfectly fit the indicated impedances on the Smith chart means that in this case the isolation port termination impedance becomes the source impedance of the composite amplifier.

Figure 19:
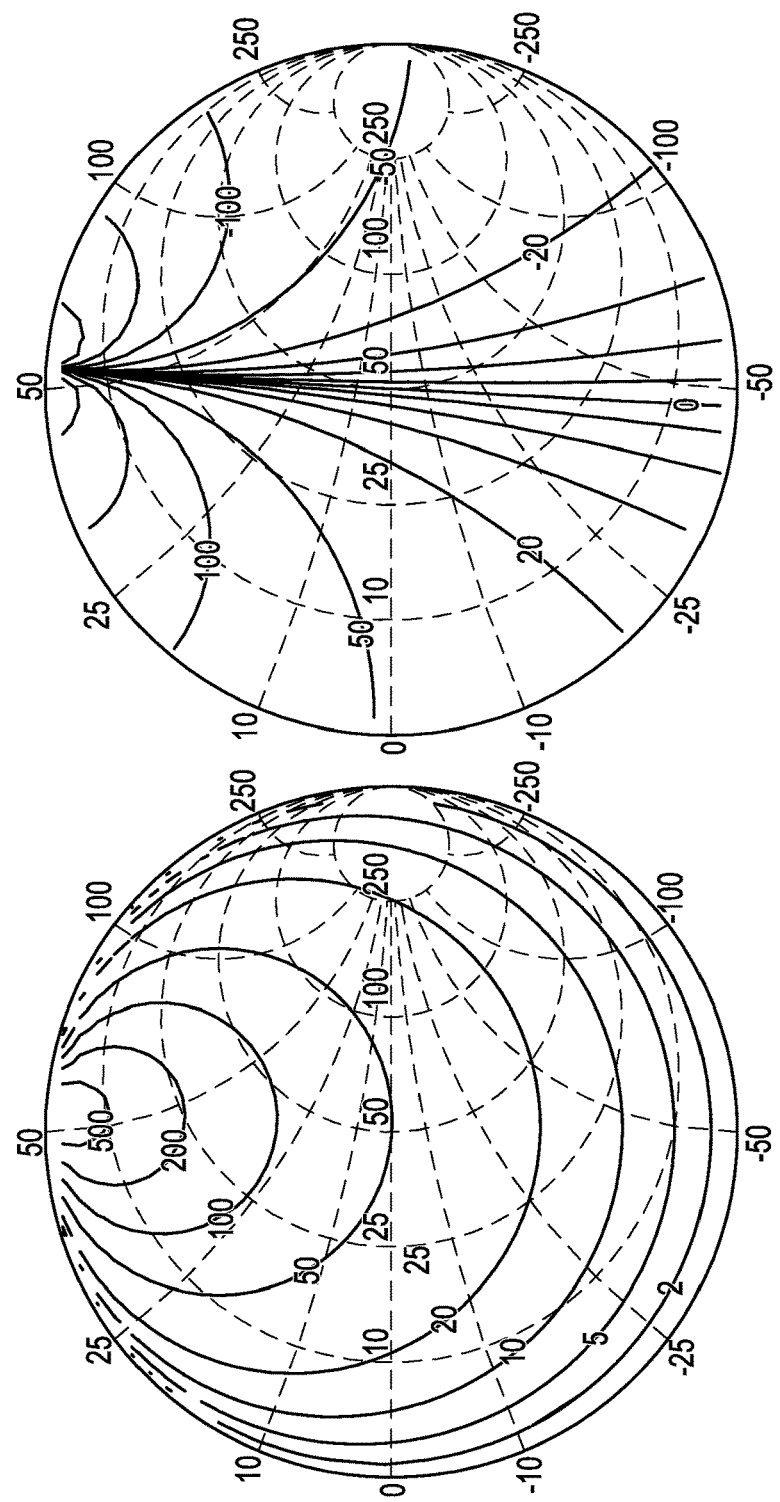
FIG. 19 shows the source impedance of the composite amplifier as a function of the isolation port termination impedance if the source impedances of the individual power amplifiers making up the composite amplifier are j20Ω.
Figure 20:
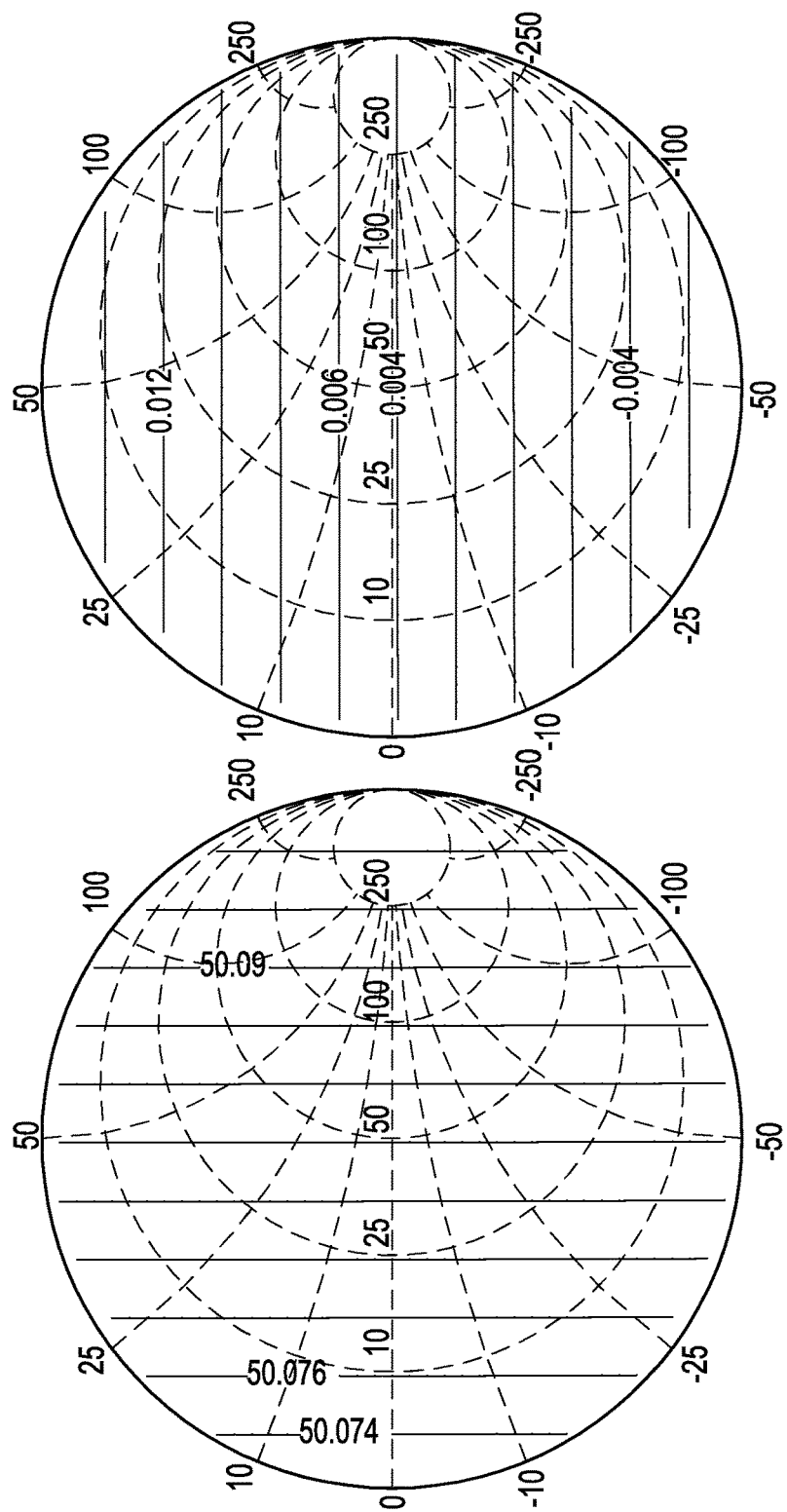
FIG. 20 shows the source impedance of the composite amplifier as a function of the isolation port termination impedance if the source impedances of the individual power amplifiers making up the composite amplifier are 49Ω.

FIG. 19 shows the source impedance of the composite amplifier as a function of the isolation port termination impedance if the source impedances of the individual power amplifiers making up the composite amplifier are j20Ω (where $j=\sqrt{-1}$). The real part of the source impedance is on the left, and the imaginary part is on the right. On each graph the origin in the center, the abscissa is the real part, and the ordinate the imaginary part, respectively, of the reflection coefficient with respect to 50Ω of the isolation port termination impedance. In this case the reflection coefficient corresponding to the source impedance of the composite amplifier is a rotation of the reflection coefficient corresponding to the isolation port termination impedance. If the source impedances of the individual power amplifiers making up the composite amplifier are j50Ω or −j50Ω this rotation is 180° so that the source impedance of the composite amplifier is the admittance of the isolation port termination scaled by 2500;

FIG. 20 shows the source impedance of the composite amplifier as a function of the isolation port termination impedance if the source impedances of the individual power amplifiers making up the composite amplifier are 49Ω. The real part of the source impedance is on the left, and the imaginary part is on the right. On each graph the origin is in the center, the abscissa is the real part, and the ordinate the imaginary part, respectively, of the reflection coefficient with respect to 50Ω of the isolation port termination impedance. In this case, the isolation port termination impedance has almost no impact on the source impedance of the composite amplifier. If the source impedances of the individual power amplifiers making up the composite amplifier are exactly 50Ω the isolation port termination impedance has no impact on the source impedance of the composite amplifier.

Figure 21:
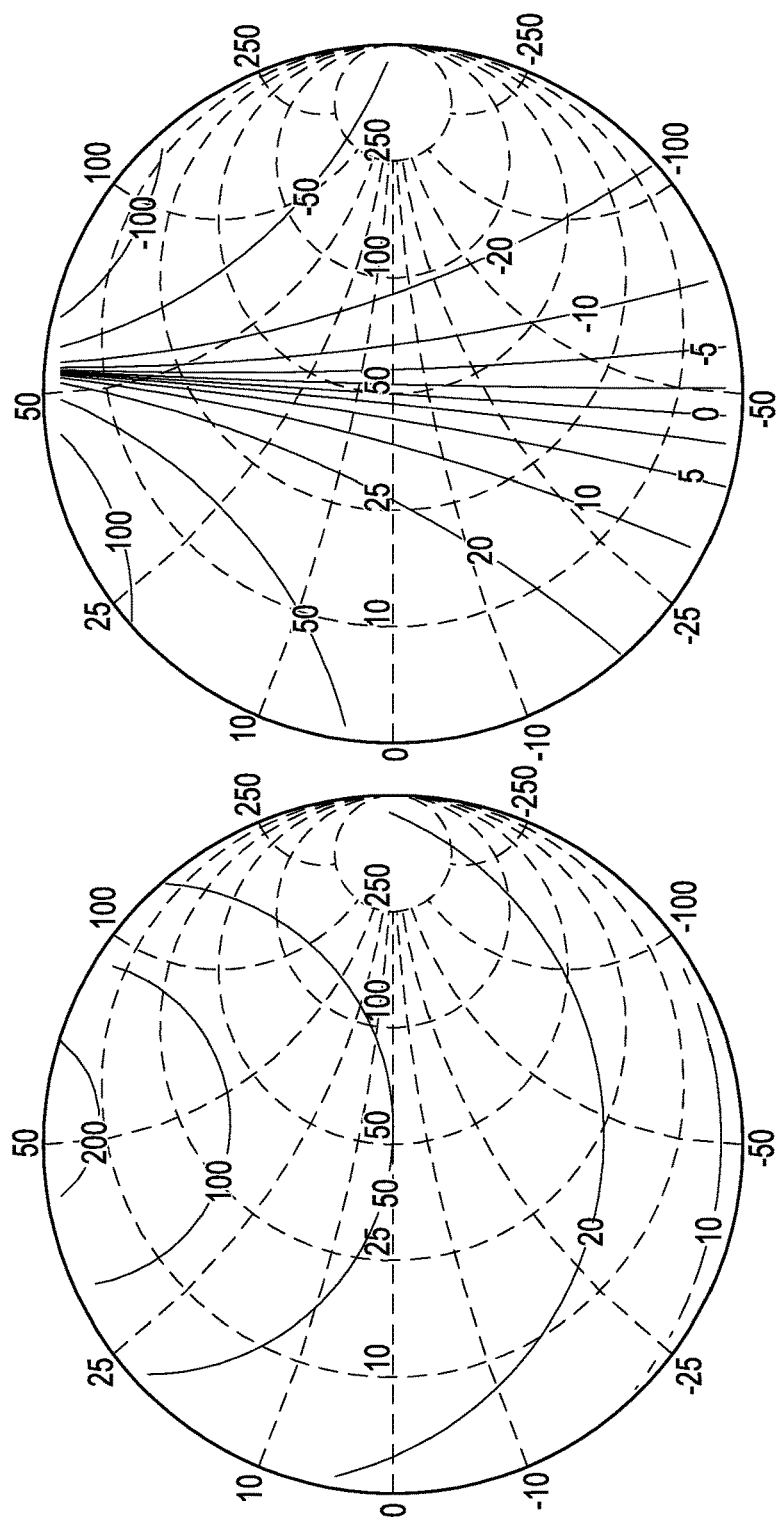
FIG. 21 shows the source impedance of the composite amplifier as a function of the isolation port termination impedance if the source impedances of the individual power amplifiers making up the composite amplifier are 30−j120Ω.

FIG. 21 shows the source impedance of the composite amplifier as a function of the isolation port termination impedance if the source impedances of the individual power amplifiers making up the composite amplifier are 30−j120Ω. The real part of the source impedance is on the left, and the imaginary part on the right. On each graph, the origin is in the center, the abscissa is the real part, and the ordinate the imaginary part, respectively, of the reflection coefficient with respect to 50Ω of the isolation port termination impedance. A source impedance of 30−j12Ω is representative of a typical industrial amplifier. It is clear that significant control over the source impedance of the composite amplifier is possible.

FIGS. 18, 19, 20, and 21 illustrate a mapping that exists between the isolation port termination impedance, Zt, and the resulting generator source impedance, Zg. For the combiners considered in FIGS. 18, 19, 20, and 21, Zt=50Ω results in a generator source impedance of 50Ω. This is the case for a combiner such as shown in FIG. 17B with inductor impedances of each inductor of j50Ω, unity coupling between the inductors, and capacitor impedances of each capacitor of −j100Ω. For a combiner such as shown in FIG. 17A in conjunction with external phase shifters (to achieve quadrature combining designed to combine two 50Ω inputs into a 50Ω load) a value of Zt=100Ω results in a generator source impedance of 50Ω.

Figures 22A, 22B:
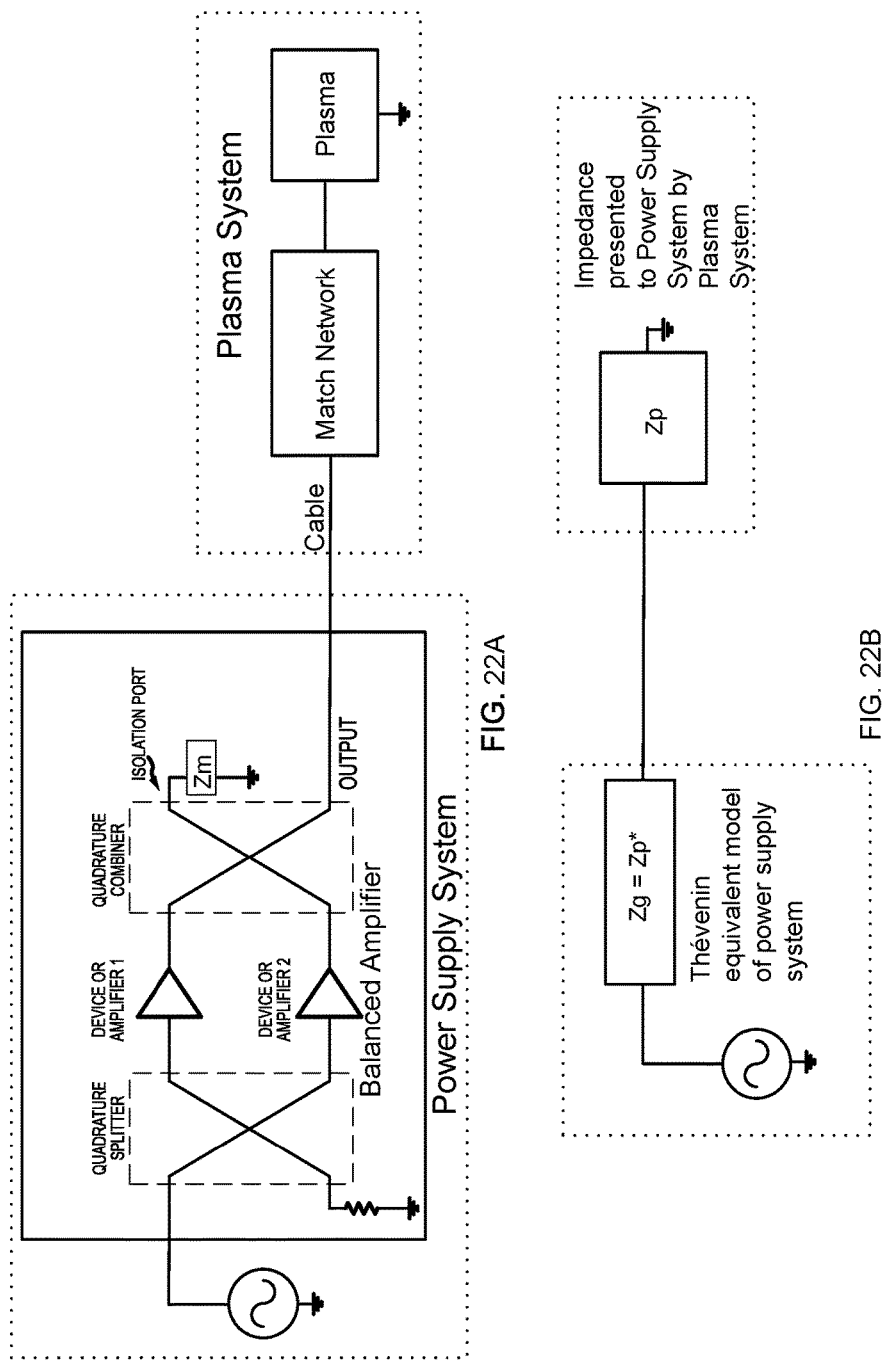
FIG. 22A is a diagram depicting a power supply system and plasma system.
FIG. 22B is a diagram depicting Thévenin equivalent models of the power supply system and plasma system depicted in FIG. 22A.

Referring to FIGS. 22A and 22B, shown are diagrams depicting an implementation where an isolation port termination impedance of Zm results in the source impedance, Zg, of a power supply system being matched (e.g., conjugate matched) to a plasma system impedance. More specifically, FIG. 22A depicts a power supply system for providing power to a plasma load of a plasma system. As shown, a balanced amplifier of the power supply system includes a first power amplifier including an input and a first-amplifier-output and a second power amplifier including an input and a second-amplifier-output. A four-port (quadrature) combiner of the balanced amplifier includes a first input port disposed to receive a first signal from the first-amplifier-output and a second input port disposed to receive a second signal from the second-amplifier-output. The four-port combiner includes an output port to provide output power to the plasma system and an isolation port. The four-port combiner is configured to combine the first signal and the second signal to apply a power signal to the output port. As shown, the termination impedance of Zm is coupled to the isolation port.

As shown in FIG. 22B (which depicts Thévinin-equivalient-models of the power supply system and the plasma system of FIG. 22A) the terminating impedance, Zm, is an impedance that results in the source impedance, Zg, of the power supply system being matched (e.g., conjugate matched) to a plasma system impedance, Zp, presented to the power supply system.

Termination resistors (for use as the termination impedance) for RF applications are generally matched to better than −20 dB return loss with respect to the designed resistor value, Rd. That is, if the actual resistor impedance is Zr, then $20 \log_{10}|Zr-Rd|/|Zr+Rd|<-20$ or $|Zr-Rd|/|Zr+Rd|<0.1$. Zr is affected by the value of the resistive element as well as parasitic capacitance and inductance in the design of the resistor. As one of ordinary skill in the art will appreciate in view of this disclosure, resistors, capacitors, inductors, mutual inductors and distributed elements (e.g., transmission lines or open or shorted transmission line stubs) may be used to realize the termination impedance.

Figures 23A, 23B:
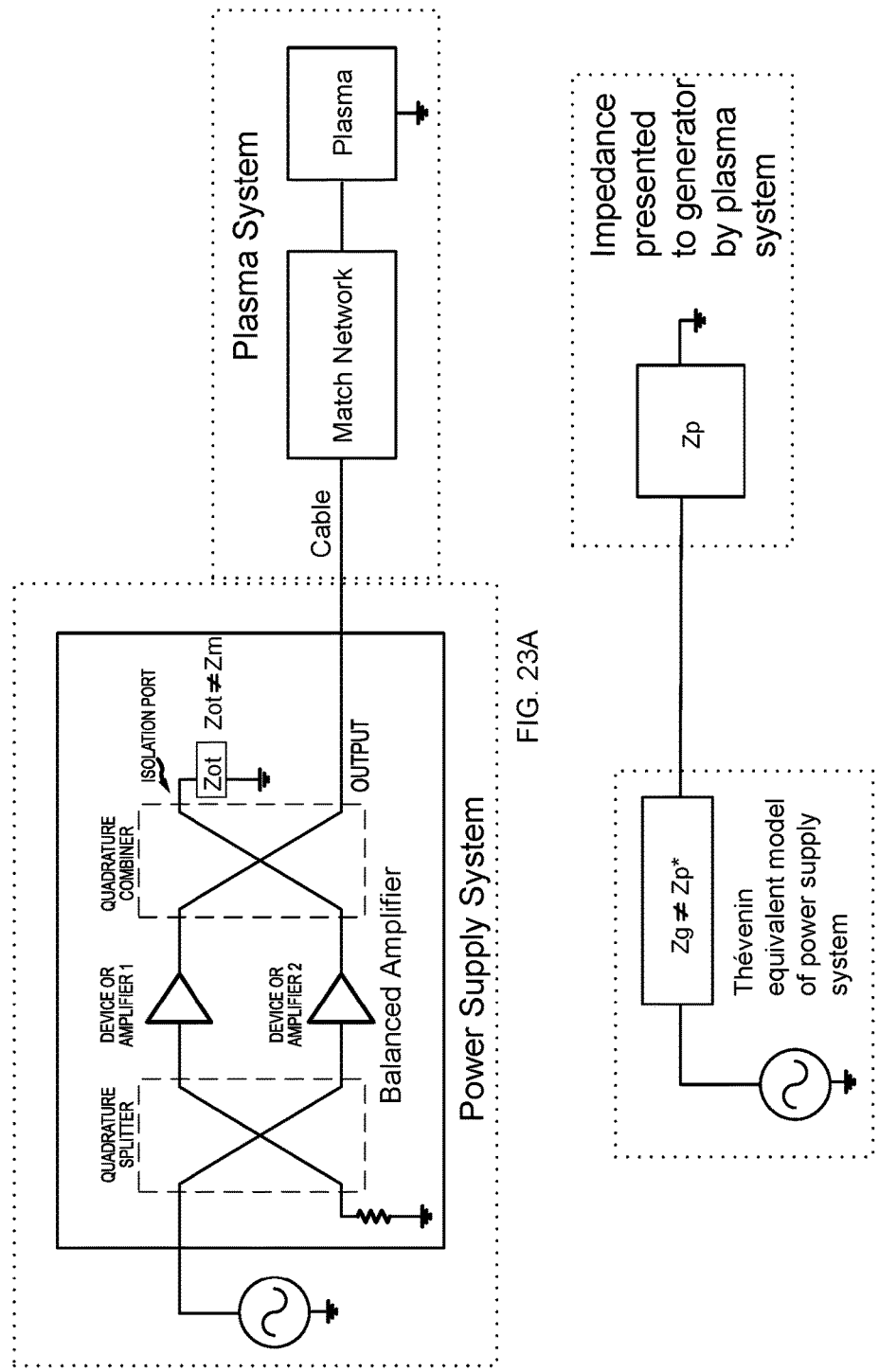
FIG. 23A is a diagram depicting another power supply system and plasma system.
FIG. 23B is a diagram depicting Thévenin equivalent models of the power supply system and plasma system depicted in FIG. 23A.

An offset in the termination impedance Zt from a given value results in a corresponding offset in generator source impedance. Referring to FIGS. 23A and 23B for example, shown is an implementation where an offset-termination-impedance, Zot, is coupled to an isolation port of the balanced amplifier. More specifically, the power supply system in FIG. 23A includes a balanced amplifier that is similar to the balanced amplifier depicted in FIG. 22A except that the isolation port is coupled to the offset-termination-impedance, Zot, which is offset from the impedance Zm (described with reference to FIGS. 22A and 22B). As shown in FIG. 23B, the result of implementing the balanced amplifier with the offset-termination-impedance, Zot, is that the source impedance of the power supply system, Zg, is not matched (e.g., is not conjugate matched) to the impedance presented to the power supply system.

For example, for a balanced amplifier in which each of the first and second power amplifiers making up the balanced amplifier has a source impedance of 30−j120Ω, we have from FIG. 21 that when the offset-termination-impedance is 16.7Ω (offset from 50Ω by 0.5 in a load reflection coefficient magnitude sense), there is a corresponding change in generator source impedance from 50Ω (what you would have had with a termination impedance of 50Ω) to 37.25+j30.23Ω. Imperfections in an isolation resistor of the termination impedance as well as in the combiner and output filter (not shown) can result in balanced amplifiers in which the source impedance of the power supply system, Zg, deviates from a designed value, Z0, typically 50Ω. Typically, such deviations are less than −16 dB in terms of return loss or $|Zg-Z0|/|Zg+Z0^*|<0.15$. For all practical purposes an offset between two impedances, Z1 and Z2 of less than 0.1 in a load reflection coefficient magnitude sense, i.e., $|Z1-Z2|/|Z1+Z2^*|<0.1$, where * designates taking the complex conjugate, means that the two impedances, Z1 and Z2 can be considered to be nominally the same impedance. For example, 61.1Ω, 49+j9.9Ω, 40.9Ω, and 49−j9.9Ω can all be considered nominally 50Ω.

In contrast, an offset in impedance of 0.3 or more between two impedances, Z1 and Z2, in a load reflection coefficient magnitude sense, can in a practical sense be considered different impedances since such offsets are highly unlikely to occur without deliberately changing an impedance value. For example, 92.9Ω, 41.7+j27.5Ω, 26.9Ω, and 41.7−j27.5Ω are highly unlikely to be just badly matched 50Ω loads. Because typical offsets in generator source impedance from design values due to imperfections in the isolation resistor as well as in the combiner and output filter can be up to 0.15 in a load reflection coefficient sense, deliberate offsets to shift the source impedance generally need to be more than 0.15 in a load reflection coefficient magnitude sense to ensure a consistent gradient in the generator sensitivity vector, $S_G$. The corresponding offset in isolation port termination impedance depends on the design, but is generally larger than the offset in $S_G$.

Referring again to the example given earlier in which each amplifier making up the balanced amplifier has a source impedance of 30−j120Ω, and Zm is a termination impedance that results in the source impedance of the power supply system, Zg, being conjugate matched to the impedance presented to the power supply system, Zp, the offset between the offset-termination-impedance, Zot, and Zm is 0.5 in a load reflection coefficient magnitude sense while the resulting offset between the impedance of the power supply system, Zg, and the impedance presented to the power supply system, Zp, is 0.36 in a load reflection coefficient magnitude sense. Because of the general requirement to offset the source impedance of the power supply system, Zg, from Zp* more than 0.15 and because of the larger offset in Zt to affect this change, the minimum effective offset in Zt to ensure a consistent gradient of the generator sensitivity vector, $S_G$, offsets in Zt generally need to be 0.3 or more in a load reflection coefficient sense to be effective. In other words, Zot generally needs to be offset from Zm by 0.3 or more in a load reflection coefficient magnitude sense: |Zot−Zm|/|Zot+Zm*|>0.3 where Zm* is the complex conjugate of Zm.

Figure 24:
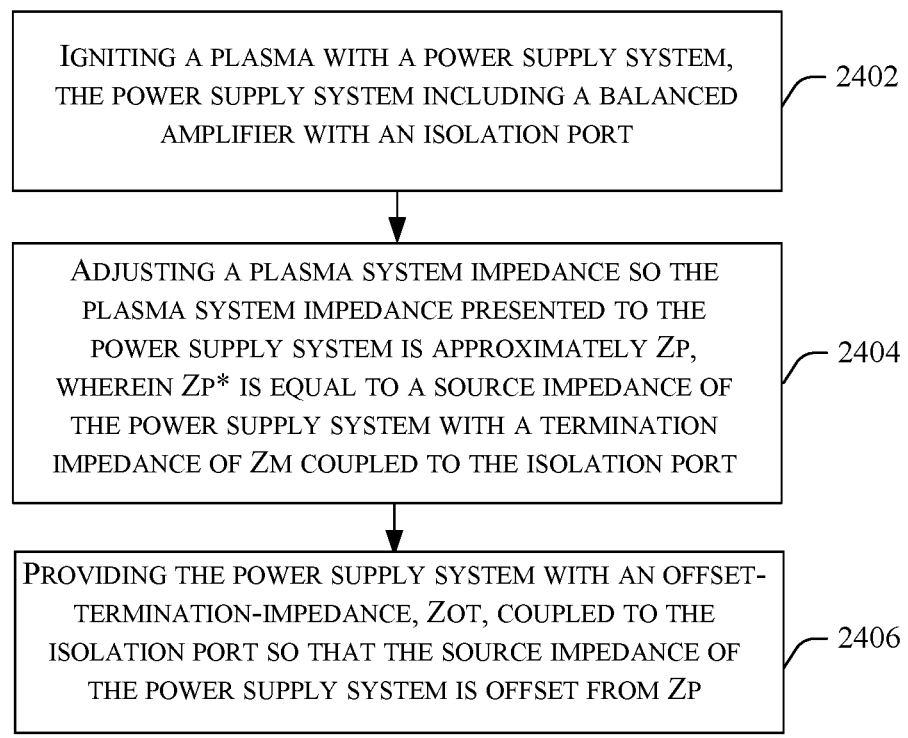
FIG. 24 is a flowchart depicting a method that may be traversed in connection with the power supply system and the plasma system depicted in FIG. 23A.

Referring to FIG. 24, shown is a flowchart depicting a method that may be traversed in connection with the embodiment described with reference to FIGS. 23A and 23B. As shown, the plasma supply system is used to ignite a plasma (e.g., in a sub-atmospheric-pressure plasma chamber)(Block 2402). As discussed above, the plasma supply system includes a balanced amplifier with a termination impedance coupled to an isolation port of the balanced amplifier. The plasma system impedance presented to the power supply system is adjusted so that the plasma system impedance presented to the power supply is approximately (in other words, nominally) Zp, wherein Zp* is equal to a source impedance of the power supply system, Zg, with a termination impedance of Zm coupled to the isolation port (Block 2404). For example, the plasma system is conjugate matched to the power supply system described with reference to FIG. 22A. To adjust the plasma system impedance presented to the power supply, the match network may be adjusted and/or the length of the cable may be adjusted.

One of ordinary skill in the art is very familiar with impedance match networks (which may include resistive, capacitive, and inductive elements) that may be adjusted (e.g., automatically adjusted) using information (e.g., voltage, current, and phase information) about the power applied to the plasma load to present the power supply system with an impedance that is nominally Zp. One of ordinary skill in the art is also familiar with control logic and hardware that translates the sensed power information (e.g., received from a directional coupler or other type of sensor) into an adjustment signal provided to the match network. Thus, details of match networks and match network control logic are not provided herein. But one of ordinary skill in the art readily appreciates that the components described with reference to FIG. 27 may be utilized in a system to adjust the match network.

Unlike prior art approaches, in the method depicted in FIG. 24 the power supply system is provided with an offset-termination-impedance, Zot, coupled to the isolation port, which results in the source impedance, Zg, of the power supply system being offset from Zp* (Block 2406). As discussed above, in many implementations Zot is offset from Zm by 0.3 or more in a load coefficient sense: |Zot−Zm|/|Zot+Zm*|>0.3 where Zm* is the complex conjugate of Zm And the source impedance, Zg, of the power supply system is offset from Zp* by 0.15 or more in a load reflection coefficient magnitude sense: |Zg−Zp*|/|Zg+Zp|>0.15, where Zp* is the complex conjugate of the impedance, Zp, presented to the power supply system by the plasma system. Applicant has found that in many sensitive plasma systems (which are prone to instability at any cable length between the power supply system and the plasma system), the offset balanced amplifier (where Zot is deliberately offset from Zm) has dramatically better stability.

It should be recognized that the order of the activates depicted in FIG. 24 need not be carried out in the order depicted in FIG. 24. In particular, an aspect of the method depicted in FIG. 24 is that the offset-termination-impedance, Zot, may be provided to the power supply system in advance of igniting the plasma. And in many implementations, the power supply system is provided with the offset-termination-impedance, Zot, as a fixed impedance (coupled to the isolation port) so that the source impedance, Zg, of the power supply system is intentionally offset from Zp* wherein Zp is an impedance that is typically presented to power supply systems. As an example, many operators of plasma systems prefer to present the power supply system with a plasma system impedance, Zp, that is nominally 50Ω, and by providing the power supply system with a source impedance, Zg, that is deliberately offset from Zp*, improved stability may be achieved.

Figure 25:
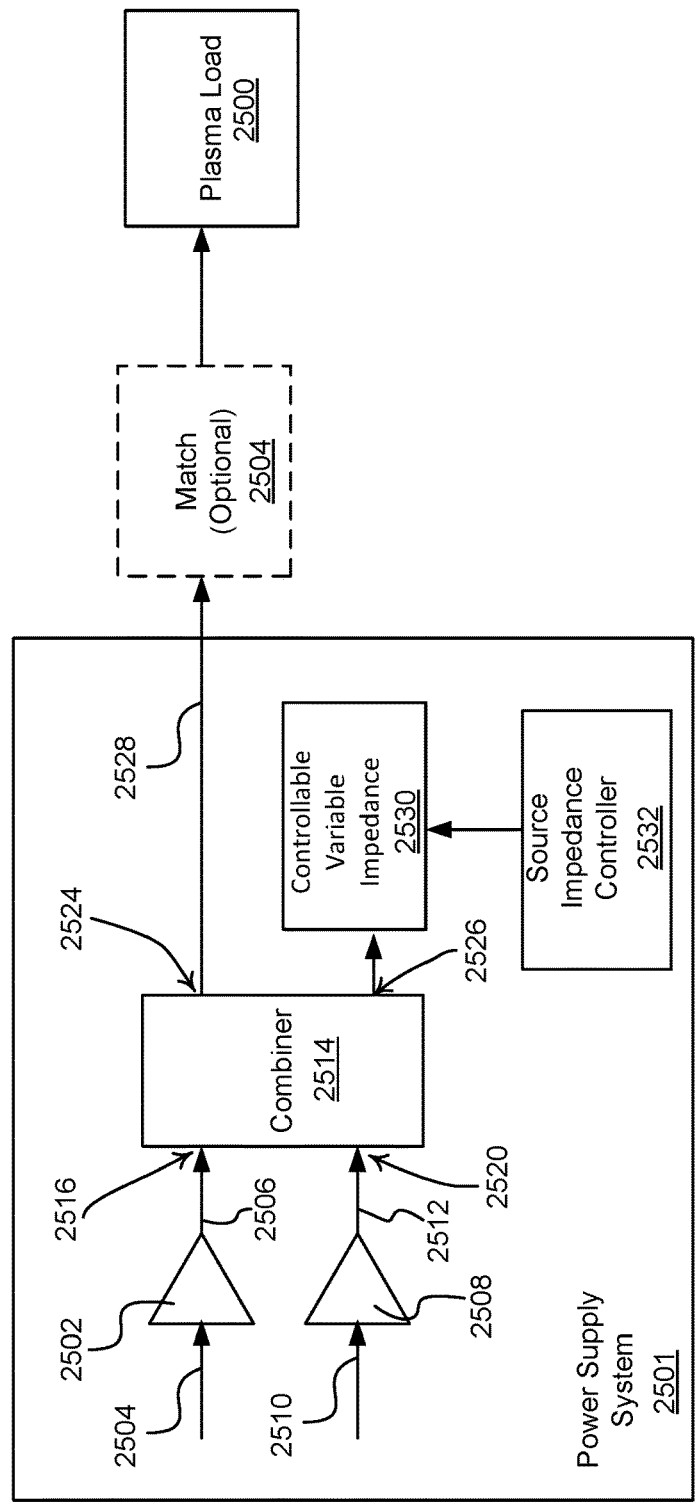
FIG. 25 is a block diagram depicting a plasma processing system.

Referring next to FIG. 25, shown is a block diagram depicting an exemplary system to provide power to a plasma load 2500. As depicted, the system includes a power supply system 2501 (also referred to as a generator 2501) that comprises a first power amplifier 2502, which includes an input 2504 and a first-amplifier-output 2506. Also shown is a second power amplifier 2508 that includes an input 2510 and a second-amplifier-output 2512. The power supply system 2501 also includes a four-port combiner 2514 that includes a first input port 2516 disposed to receive a first signal from the first-amplifier-output 2506, a second input port 2520 disposed to receive a second signal from the second-amplifier-output 2512, an output port 2524 to provide output power, and an isolation port 2526 disposed to couple to a terminating impedance. In general, the combiner 2514 is configured to combine the first signal from the first-amplifier-output 2506 and the second signal from the second-amplifier-output 2512 to apply a power signal 2528 at the output port 2524. In some embodiments, the second signal is phase shifted between 60 and 120 degrees with respect to the first signal, and in an exemplary embodiment, the second signal is phase shifted 90 degrees with respect to the first signal.

As shown, a controllable variable impedance component 2530 is coupled to the isolation port 2526 as the terminating impedance, and a source impedance controller 2532 is coupled to the controllable variable impedance component 2530. The source impedance controller 2532 generally operates to adjust the controllable-variable impedance component 2530 in order to modify the source impedance of the power supply system 2501. As shown, the power 2528 from the combiner 2514 may be applied either directly to the plasma load or through an optional impedance matching network.

As discussed further herein, among several advantages, adjusting the source impedance of the power supply system 2501 may enable any instabilities in the output power of the power supply system 2501 to be reduced. As discussed above, instabilities may occur as a result of interactions between the power supply system 2501 and the nonlinear impedance of the plasma load 2500. In addition, for many applications it is desirable to apply pulsed RF power to the plasma load 2500, and adjustment of the source impedance helps to achieve a desired shape of the applied pulses. In particular, when the applied power is pulsed, the impedance of the plasma load 2500 varies over the duration of the pulse in response to the application of the pulse itself, and adjustment of the source impedance of the power supply system 2501 enables forward and reflected power during the pulses to be modified as discussed further herein.

Figure 26:
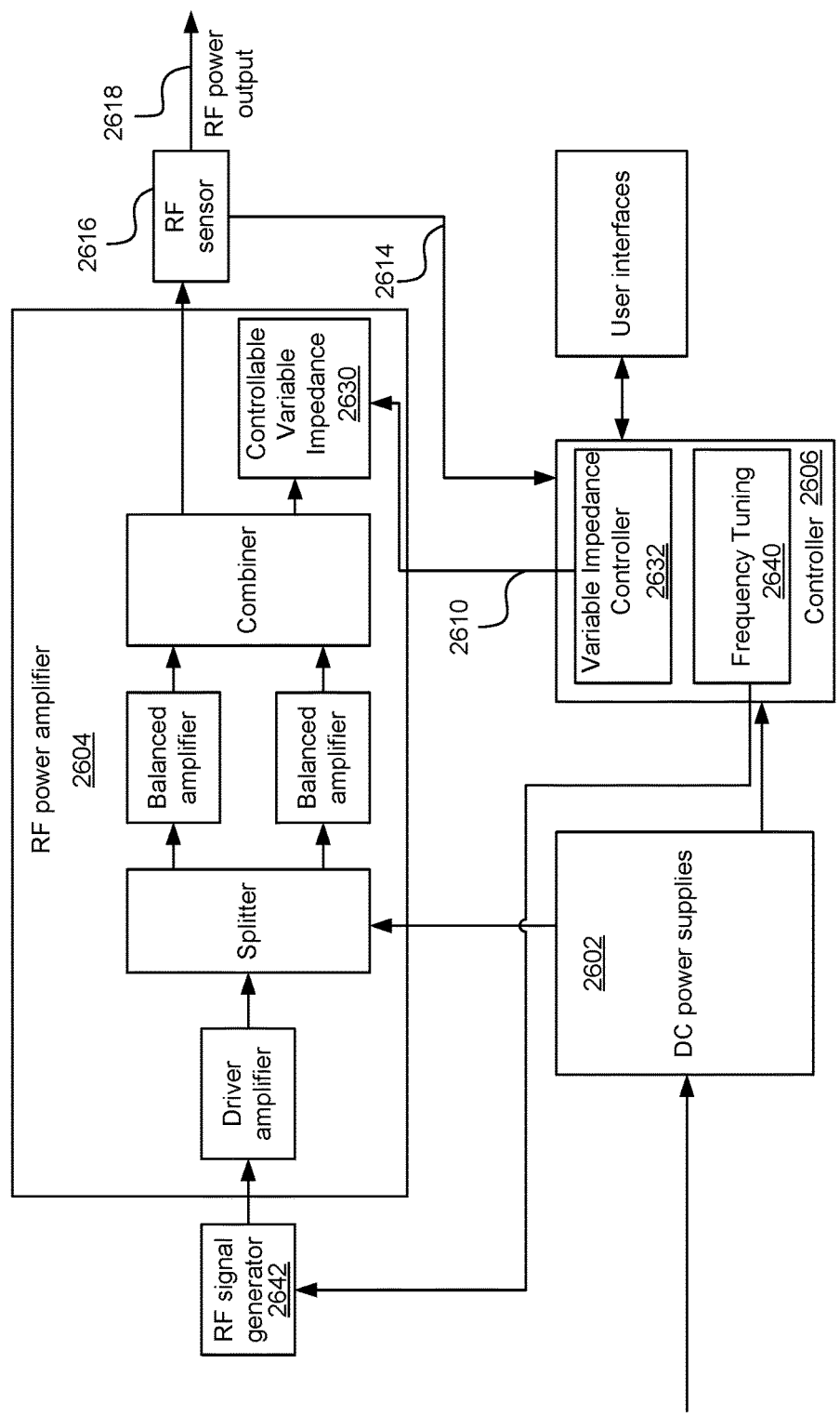
FIG. 26 is a block diagram depicting an exemplary embodiment of a generator.

Referring next to FIG. 26, it is a block diagram depicting components of an exemplary embodiment of a generator (e.g., an exemplary embodiment of the power supply system 2501). As shown, the generator includes one or more DC power supplies 2602 that receive AC power and produce DC power to power a radio frequency (RF) power amplifier 2604 and a controller 2606. In general, the power amplifier 2604 amplifies the output of a signal generator 2642 to generate output power 2618 at a particular frequency.

The controller 2606 in this embodiment includes a variable impedance controller 2632 that provides, responsive to an output signal 2614 from a sensor 2616, an impedance control signal 2610 to the controllable variable impedance 2630. The sensor 2616 may be realized, for example, by a directional coupler or VI sensor, and the sensor 2616 may monitor one or more parameters indicative of an interaction between the generator and the plasma load 2500; a parameter indicative of plasma ignition; and a parameter indicative of pulse shape in a pulsed power application. For example, the output signal 2614 may be indicative of one or more of an impedance presented to the power amplifier 2604, voltage, current, and power produced by the generator. In response, the controllable variable impedance 2630 is adjusted based upon the impedance control signal 2610 to achieve a source impedance that achieves one or more objectives.

For example, the source impedance of the generator may be adjusted to reduce plasma instabilities by achieving a mismatch between the source impedance of the generator from an impedance of the plasma load and then aligning an impedance trajectory of the plasma load with contours of an open loop profile of the power supply. In the embodiment depicted in FIG. 26, for example, a frequency tuning portion 2640 of the controller 2606 may be used to adjust the frequency of an RF signal generator 2642 in order to align the trajectory of the plasma load 2500 with contours of an open loop profile of the generator. One of ordinary skill in the art will also appreciate that a match (e.g., optional match 2504) or cable length between the generator and plasma load 2500 may be adjusted to align the trajectory of the plasma load with contours of an open loop profile of the generator.

The source impedance controller 2532, 2632 (and the controller 2606 generally) may be implemented or performed in part with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 27:
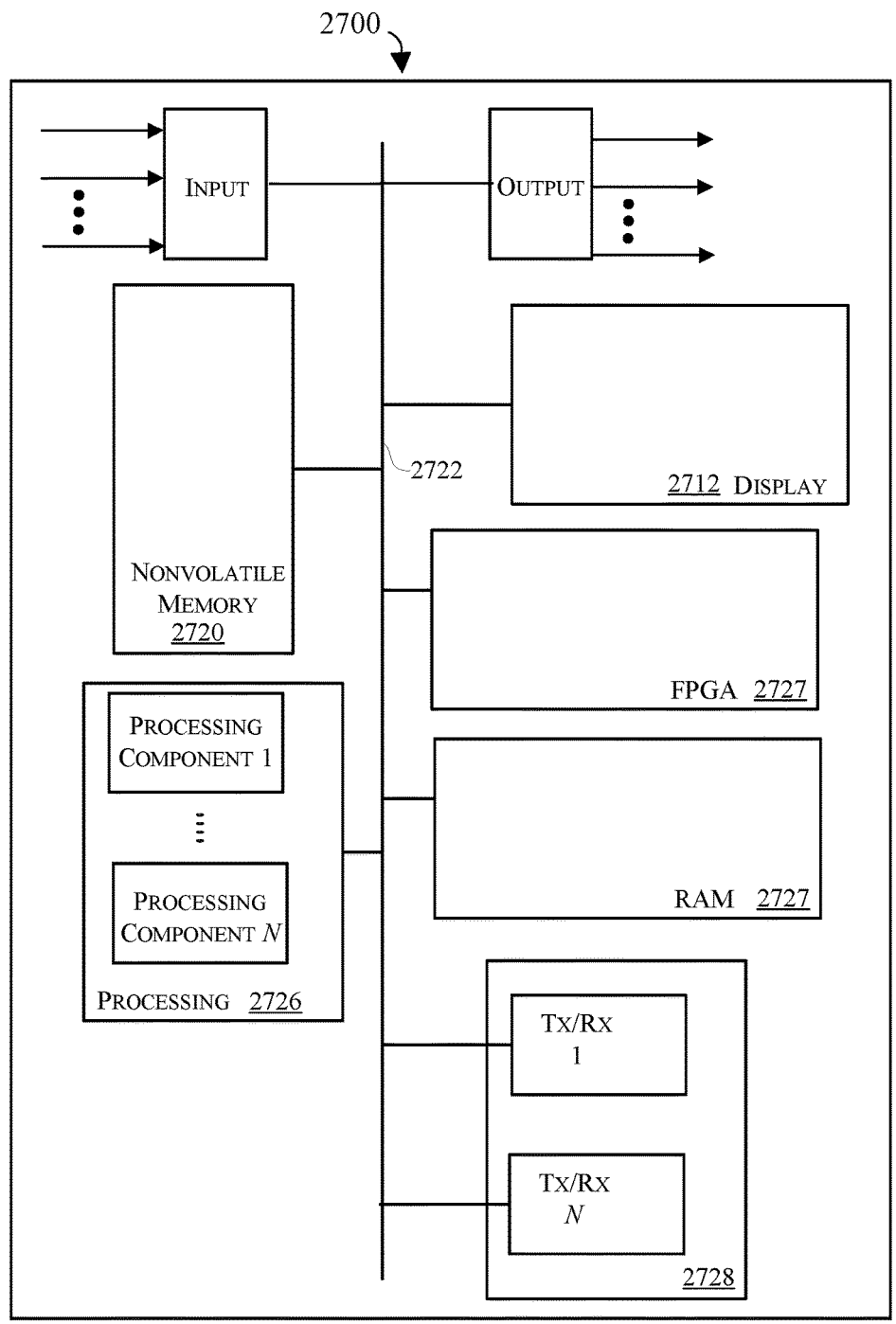
FIG. 27 is a block diagram depicting physical components that may be used to realize the controllers of FIGS. 25 and 26.
Figure 28:
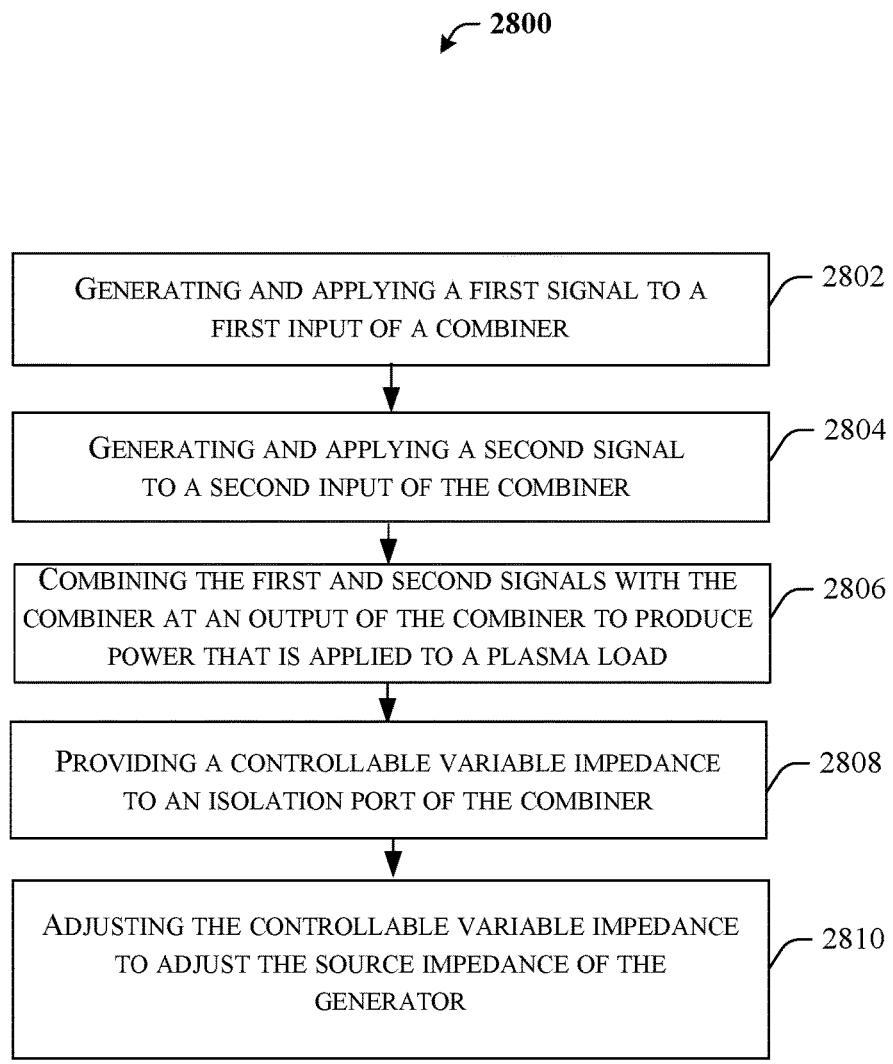
FIG. 28 is a flowchart depicting an exemplary method that may be traversed in connection with embodiments described herein.

The methods described in connection with the embodiments disclosed herein may be embodied directly in hardware, in processor executable instructions encoded in non-transitory processor readable medium, or in a combination of the two. Referring to FIG. 27 for example, shown is a block diagram depicting physical components that may be utilized to realize the source impedance controller 2532, 2632 (and the controller 2606 generally) according to an exemplary embodiment. As shown, in this embodiment a display portion 2712 and nonvolatile memory 2720 are coupled to a bus 2722 that is also coupled to random access memory ("RAM") 2724, a processing portion (which includes N processing components) 2726, a field programmable gate array (FPGA) 2727, and a transceiver component 2728 that includes N transceivers. Although the components depicted in FIG. 27 represent physical components, FIG. 27 is not intended to be a detailed hardware diagram; thus many of the components depicted in FIG. 27 may be realized by common constructs or distributed among additional physical components. Moreover, it is contemplated that other existing and yet-to-be developed physical components and architectures may be utilized to implement the functional components described with reference to FIG. 27.

This display portion 2712 generally operates to provide a user interface for a user, and in several implementations, the display is realized by a touchscreen display. In general, the nonvolatile memory 2720 is non-transitory memory that functions to store (e.g., persistently store) data and processor executable code (including executable code that is associated with effectuating the methods described herein). In some embodiments for example, the nonvolatile memory 2720 includes bootloader code, operating system code, file system code, and non-transitory processor-executable code to facilitate the execution of a method described with reference to FIG. 25 described further herein.

In many implementations, the nonvolatile memory 2720 is realized by flash memory (e.g., NAND or ONENAND memory), but it is contemplated that other memory types may be utilized as well. Although it may be possible to execute the code from the nonvolatile memory 2720, the executable code in the nonvolatile memory is typically loaded into RAM 2724 and executed by one or more of the N processing components in the processing portion 2726.

The N processing components in connection with RAM 2724 generally operate to execute the instructions stored in nonvolatile memory 2720 to enable the source impedance of a generator to be modified to achieve one or more objectives. For example, non-transitory processor-executable instructions to effectuate the methods described with reference to FIG. 25 may be persistently stored in nonvolatile memory 2720 and executed by the N processing components in connection with RAM 2724. As one of ordinarily skill in the art will appreciate, the processing portion 2726 may include a video processor, digital signal processor (DSP), graphics processing unit (GPU), and other processing components.

In addition, or in the alternative, the FPGA 2727 may be configured to effectuate one or more aspects of the methodologies described herein (e.g., the method described with reference to FIG. 25). For example, non-transitory FPGA-configuration-instructions may be persistently stored in non-volatile memory 2720 and accessed by the FPGA 2727 (e.g., during boot up) to configure the FPGA 2727 to effectuate the functions of the source impedance controllers 2532, 2632.

The input component operates to receive signals (e.g., the output signal 2614 from sensor 2616) that are indicative of one or more aspects of the output power 2618 and/or the plasma load 2200. The signals received at the input component may include, for example, voltage, current, forward power, reflected power and plasma load impedance. The output component generally operates to provide one or more analog or digital signals to effectuate an operational aspect of the generator. For example, the output portion may provide the impedance control signal 2610 described with reference to FIG. 26. When the controllable variable impedance 2630 is realized by a collection of discreetly switched capacitors, for example, the impedance control signal 2610 may be a digital signal that is encoded with an address (e.g., a binary address) of particular discrete capacitors to select a particular impedance. And if the controllable variable impedance 2630 is realized by a continuously variable capacitor, the impedance control signal 2610 may be an analog signal that varies in magnitude based upon a particular position of the continuously variable capacitor.

The depicted transceiver component 2728 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Referring next to FIG. 25, it is a flowchart depicting a method for adjusting the source impedance of a generator that may be traversed in connection with several of the embodiments disclosed herein. As shown, a first signal (e.g., that is output by a first power amplifier 2202) is generated and applied to a first input of a combiner (e.g., the first input port 2216 of the combiner 2214)(Block 2502), and a second signal (e.g., that is output by a second power amplifier 2208) is generated and applied to a second input of the combiner (e.g., the second input port 2220 of the combiner 2214) (Block 2504).

The first and second signals are then combined with the combiner at an output of the combiner to produce power that is delivered to the plasma load (Block 2506). As shown, a controllable variable impedance (e.g., the controllable variable impedance 2230, 2630) is provided to an isolation port (e.g., the isolation port 2226) of the combiner (Block 2508), and the controllable variable impedance is adjusted to vary the source impedance of the generator (Block 2510).

As used herein, the recitation of "at least one of A, B and C" is intended to mean "either A, B, C or any combination of A, B and C." The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power supply system for providing power to a plasma load, the power supply system comprising:
   a first power amplifier including an input and a first-amplifier-output;
   a second power amplifier including an input and a second-amplifier-output;
   a four-port combiner including a first input port disposed to receive a first signal from the first-amplifier-output, a second input port disposed to receive a second signal from the second-amplifier-output, an output port to provide output power, and an isolation port, wherein the four-port combiner is configured to combine the first signal and the second signal to apply a power signal to the output port;
   an offset-termination-impedance, Zot, coupled to the isolation port, the offset-termination-impedance, Zot, is offset from an impedance, Zm, that results in the source impedance of the power supply system being matched to a plasma system impedance, Zp, presented to the power supply system by the plasma system if the impedance, Zm, is coupled to the isolation port instead of the offset-termination-impedance, Zot, wherein $|Zot-Zm|/|Zot+Zm^*|>0.3$ where $Zm^*$ is the complex conjugate of Zm.

2. The power supply system of claim 1, wherein Zp and Zm are approximately 50 Ohm so $|Zp-50|/|Zp+50|<0.1$ and $|Zm-50|/|Zm+50|<0.1$.

3. A method for providing power to a plasma load, the method comprising:
   generating a first signal and applying the first signal to a first input of a combiner;
   generating a second signal and applying the second signal to a second input of the combiner;
   combining the first and second signals with the combiner at an output of the combiner to produce power that is delivered to the plasma load;
   providing an offset-termination-impedance, Zot, to an isolation port of the combiner, the offset-termination-impedance, Zot, is offset from an impedance, Zm, that results in the source impedance of the power supply system being matched to a plasma system impedance, Zp, presented to the power supply system by the plasma system if the impedance, Zm, is coupled to the isolation port instead of the offset-termination-impedance, Zot, wherein $|Zot-Zm|/|Zot+Zm^*|>0.3$ where $Zm^*$ is the complex conjugate of Zm.

4. The method of claim 3, wherein Zp and Zm are approximately 50 Ohm so $|Zp-50|/|Zp+50|<0.1$ and $|Zm-50|/|Zm+50|<0.1$.

5. A power supply system for providing power to a plasma load, the power supply system comprising:
   means for generating a first signal and applying the first signal to a first input of a combiner;
   means for generating a second signal and applying the second signal to a second input of the combiner;
   combiner means for combining the first and second signals to produce power that is applied to the plasma load; and
   an offset-termination-impedance, Zot, coupled to an isolation port of the combiner, the offset-termination-impedance, Zot, is offset from an impedance, Zm, that results in the source impedance of the power supply system being matched to a plasma system impedance, Zp, presented to the power supply system by the plasma system if the impedance, Zm, is coupled to the isolation port instead of the offset-termination-impedance, Zot, wherein |Zot−Zm|/|Zot+Zm*|>0.3 where Zm* is the complex conjugate of Zm.

6. The power supply system of claim 5, wherein Zp and Zm are approximately 50 ohm so |Zp−50|/|Zp+50|<0.1 and |Zm−50|/|Zm+50|<0.1.

7. A method for providing power to a plasma load, the method comprising:

igniting a plasma with a power supply system, the power supply system including a balanced amplifier with an isolation port;

adjusting a plasma system impedance so the plasma system impedance presented to the power supply system is approximately Zp, wherein Zp* is a complex conjugate of Zp, and Zp* is a source impedance of the power supply system with a termination impedance of Zm coupled to the isolation port; and providing the power supply system with an offset-termination-impedance, Zot, coupled to the isolation port, wherein Zot is offset from Zm by at least 0.3 in a load reflection coefficient magnitude sense so the source impedance of the power supply system is offset from Zp*.

8. The method of claim 7, wherein providing the power supply system with an offset-termination-impedance, Zot, includes providing the power supply system with an offset-termination-impedance, Zot, so the source impedance of the power supply system is offset from Zp* by at least 0.15 in a load reflection coefficient magnitude sense.

9. The method of claim 7, wherein the offset-termination-impedance, Zot, is provided to the power supply system as a fixed termination impedance in advance of igniting the plasma.

* * * * *